United States Patent
Yutaka et al.

(10) Patent No.: US 11,115,122 B2
(45) Date of Patent: Sep. 7, 2021

(54) OPTICAL WIRELESS MESH NETWORK COMMUNICATION SYSTEM

(71) Applicant: QUANTUM DRIVE CO., LTD., Naha (JP)

(72) Inventors: Koichiro Yutaka, Okinawa (JP); Kaoru Tomishima, Okinawa (JP); Yoshinori Namihira, Okinawa (JP); Yo Maeda, Okinawa (JP); Kazushi Miyagi, Okinawa (JP)

(73) Assignee: QUANTUM DRIVE CO., LTD.

( * ) Notice: Subject to any disclaimer, the term of this patent is extended or adjusted under 35 U.S.C. 154(b) by 0 days.

(21) Appl. No.: 17/059,116

(22) PCT Filed: Oct. 17, 2018

(86) PCT No.: PCT/JP2018/038565
§ 371 (c)(1),
(2) Date: Nov. 25, 2020

(87) PCT Pub. No.: WO2019/230014
PCT Pub. Date: Dec. 5, 2019

(65) Prior Publication Data
US 2021/0211197 A1    Jul. 8, 2021

(30) Foreign Application Priority Data

May 31, 2018    (JP) ............................. JP2018-105165

(51) Int. Cl.
*H04B 10/2575*    (2013.01)

(52) U.S. Cl.
CPC . *H04B 10/25752* (2013.01); *H04B 10/25759* (2013.01)

(58) Field of Classification Search
CPC ................ H04B 10/25752; H04B 10/25759
See application file for complete search history.

(56) References Cited

U.S. PATENT DOCUMENTS

| 2012/0093520 A1* | 4/2012 | Draaijer ............. H04B 10/1125 398/165 |
| 2012/0224860 A1* | 9/2012 | Kim ..................... H04B 10/116 398/128 |

(Continued)

FOREIGN PATENT DOCUMENTS

| JP | H11186968 A | 7/1999 |
| JP | 2000059382 A | 2/2000 |

(Continued)

OTHER PUBLICATIONS

Asahara, N. et al., "A Study on Indoor Optical Wireless Communication Systems With Mesh Type Network Technology," 2006 IEICE General Conference (National Convention Record of Institute of the Electronics, Information and Communication Engineers); 1 page.

(Continued)

*Primary Examiner* — Mina M Shalaby
(74) *Attorney, Agent, or Firm* — Lerner, David, Littenberg, Krumholz & Mentlik, LLP

(57) ABSTRACT

A network capable of 1:n communication in an optical wireless mesh network is provided. An optical wireless communication network communication system A1 comprises an optical wireless communication network communication system A1 comprising: an optical transmitter Ti and an optical receiver Ri, and an optical fiber cable or a coaxial cable for transmitting a signal received by the optical receiver Ri to the optical transmitter Ti at each node, wherein the n+1 node Ni is connected by a network, the optical wireless communication transceiver Si at each node Ni is capable of transmitting simultaneously to all the optical (Continued)

wireless communication transceivers Sj of the other n nodes Nj when its own node Ni and all of the other n nodes Nj satisfy a predetermined condition, and can be received simultaneously from all the optical wireless communication transceivers Sj of the other n nodes Nj.

11 Claims, 11 Drawing Sheets

(56) References Cited

U.S. PATENT DOCUMENTS

| | | | | |
|---|---|---|---|---|
| 2012/0230701 | A1* | 9/2012 | Murata | H04B 10/1123 398/140 |
| 2013/0236194 | A1* | 9/2013 | Saunders | H04B 10/70 398/163 |
| 2017/0245945 | A1* | 8/2017 | Zuhars | A61B 90/39 |

FOREIGN PATENT DOCUMENTS

| | | | |
|---|---|---|---|
| JP | 2001168943 | A | 6/2001 |
| JP | 2002158730 | A | 5/2002 |
| JP | 2004342448 | A | 12/2004 |
| JP | 2005055567 | A | 3/2005 |
| JP | 2005354553 | A | 12/2005 |
| JP | 2011109185 | A | 6/2011 |
| JP | 2012186662 | A | 9/2012 |
| JP | 2012521707 | A | 9/2012 |
| JP | 2013510497 | A | 3/2013 |
| JP | 2015510373 | A | 4/2015 |
| JP | 2017076837 | A | 4/2017 |
| JP | 2017536144 | A | 12/2017 |

OTHER PUBLICATIONS

International Search Report for PCT/JP2018/038565 dated Dec. 18, 2018; 3 pages.
International Preliminary Report on Patentability for Application No. PCT/JP2018/038565, dated Dec. 1, 2020, 12 pages.

* cited by examiner

OPTICAL WIRELESS MESH NETWORK COMMUNICATION SYSTEM

CROSS-REFERENCE TO RELATED APPLICATIONS

The present application is a national phase entry under 35 U.S.C. § 371 of International Application No. PCT/JP2018/038565, filed on Oct. 17, 2018, which claims priority from Japanese Patent Application No. 2018-105165, filed on May 31, 2018, the disclosures of all of which are incorporated herein by reference.

TECHNICAL FIELD

The present invention relates to an optical wireless mesh network communication system. In particular, it relates to an optical wireless mesh network communication system that enables optical wireless communication of 1:n (n is a positive integer of 2 or more, hereinafter the same in this specification).

BACKGROUND ART

Though an optical cable network using optical fiber is an indispensable technology for present optical communication, there is still a place where an optical cable is difficult to lay. For example, communication between ships, communication between buildings sandwiching a main street, a narrow underground space where cabling is difficult, an area of high radioactivity, etc. On the other hand, by the appearance of a LED (Light Emitting Diode) light source, a modulation of several 10 kHz became possible, and research and development of visible light communication progressed. Since light is divergent in LED, it is not suitable for long distance telecommunication. Still, communication is possible unless blocked by obstacles in a range where straight-line light can reach. Therefore, it is desired to construct an optical wireless communication network using LEDs or the like where it is difficult to lay an optical cable.

Concerning an optical wireless mesh network, an example is disclosed in which nodes are provided in sections of a mesh, and 1:1 communication is performed between terminals installed in the nodes (see Non-Patent Document 1).

RELATED ART DOCUMENTS

Non-Patent Document

Non-Patent Document 1

Nobuyuki Asahara, "Study on indoor optical wireless communication systems using mesh-type network topology" National Convention Record of Institute of the Electronics, Information and Communication Engineers, 2006.

SUMMARY OF THE INVENTION

Problems to be Solved by the Invention

However, in a conventional optical communication network, including a mesh network described in the non-patent document 1, 1:1 communication between two terminals using a laser (LD) has been used. Incidentally, in a LED light source for emitting a wide angle, it is possible to communicate 1:n for communicating between a plurality of terminals. Though a controller has carried out the control of the communication route until now, when a node having the controller is longitudinally connected since a delay of an optical signal is significant, and an optical loss is also big, it could only transmit light up to a few nodes. By eliminating the controller, since the delay of the optical signal can be reduced, and the optical loss can also be reduced, the improvement of the transmission characteristics of the optical wireless mesh network is expected. It is another object of the present invention to improve transmission characteristics of an optical wireless mesh network and to make a detouring of a link more reliably.

It is an object of the present invention to provide a network capable of 1:n communication in an optical wireless mesh network. It is another object of the present invention to improve transmission characteristics of an optical wireless mesh network and detouring a link more reliably.

Means for Solving the Problems

An optical wireless mesh network communication system A1 according to the first aspect of the present invention is, for example, as shown in FIG. 1, comprises an optical wireless communication transceiver $S_i$ having an optical transmitter $T_i$ (i is a positive integer) and an optical receiver $R_i$ and an optical fiber cable or a coaxial cable for transmitting signals received by the optical receiver $R_i$ to the optical transmitter $T_i$, in each node.

The optical wireless mesh network communication system A1 connects n+1 nodes $N_i$ in the network.

The optical wireless communication transceiver $S_i$ in each of the nodes $N_i$ is capable of communicating with the optical wireless communication transceiver $S_j$ in the correspondent node $N_j$ (j is a positive integer, $j \neq i$), if the correspondent node satisfies conditions that (1) the correspondent node $N_j$ is within a predetermined straight-line distance for optical communication, (2) there is no obstacle blocking or absorbing light on the way, and (3) both the optical transmitter $T_i$ and the optical receiver $R_i$ are active.

The optical wireless communication transceiver $S_i$ in each of the nodes $N_i$ is capable of simultaneously transmitting with a wide angle of transmitted light to 3/5 or more optical wireless communication transceivers $S_j$ in the other n nodes $N_j$ and simultaneously receiving a wide angle of transmitted light from 3/5 or more optical wireless communication transceivers $S_j$ in the other n nodes $N_j$ when its own node $N_i$ and all of the other n nodes $N_j$ satisfy the conditions of (1) to (3).

In each of the nodes $N_i$, the optical wireless communication transceiver $S_i$ includes a controller $C_i$ for format conversion of an input signal to a communication signal according to the network when the input signal is input from input apparatus 12 in a node to which the input apparatus 12 is connected, and a controller $C_i$ for format conversion of a communication signal relating to the network to an output signal when output apparatus outputs the output signal from the optical wireless communication transceiver $S_i$ to the output apparatus 13 in a node to which the output apparatus 13 is connected.

Here, the network is not limited to the hexagon, as shown in FIG. 1, and the lower limit may be a triangle (n=2) if the network is a polygon, and the upper limit may be about 32 polygons (n=31). When applied to the real world, it is difficult to realize the arrangement of the nodes of the regular hexagon, as shown in FIG. 1. In particular, it is difficult to unify the emission angle of the optical transmitter $T_i$ and the light receiving angle of the optical receiver $R_i$ in all nodes. For example, in 120 degrees, the margin is preferably 120±30 degrees, more preferably 120±20 degrees, taking into account the margin. And 120 degrees shall also be deemed to be practically transmittable within the above margin. The distance is preferably a target distance of ±30%, preferably a target distance of ±20%. The same applies to the following embodiments. The reason why the number of nodes Nj is set to 3/5 or more is that all of the nodes are preferable, but when an obstacle that blocks or absorbs light exists in the middle, the network may be configured by avoiding this obstacle. In addition, the input apparatus or the output apparatus is not limited to a terminal, and the input apparatus or the output apparatus includes an interface with Wi-Fi, a mobile base station, or Ethernet (Registered Trademark). In addition, in this description, the input/output apparatus 12 & 13 include any of the input apparatus 12, the output apparatus 13, and an apparatus having both the functions of the input apparatus and the output apparatus.

With this configuration, since using an LED light source that emits light at a wide angle, it is possible to provide a network capable of communicating 1:n in the optical wireless mesh network. An organic EL (Electroluminescence) light source may be used. Further, the LD (Laser Diode) light source may be emitted at a wide angle, for example, in combination with a diffusion medium. In addition, since the routing control of the controller is excluded, the transmission characteristics of the optical wireless mesh network can be improved. In addition, since the number of detour routes is increased compared with the prior art, it is possible to detour the link more reliably. In addition, it is possible to construct a network that takes advantage of the spread of light.

An optical wireless mesh network communication system A2 according to the second aspect of the present invention, as shown in FIGS. 8 and 2, for example, comprises an optical wireless communication transceiver Si having an optical transmitter Ti and an optical receiver Ri and an optical fiber cable or a coaxial cable for transmitting signal receive by the optical receiver Ri to the optical transmitter Ti in each node Ni, an optical wireless mesh network communication system A2 comprises a network of a triangular, square, or hexagonal or a network of mixed polygons of different angular number, each of the nodes Ni is located in a section of the network, and the node Nj of the communication partner is a node provided in a plurality of adjacent areas, the optical wireless communication transceiver Si in each of the nodes Ni is capable of communicating with the optical wireless communication transceiver in the correspondent node, if the correspondent node satisfies conditions that (1) the correspondent node is within a predetermined straight-line distance for optical communication, (2) there is no obstacle blocking or absorbing light on the way, (3) both the optical transmitters Ti, Tj and the optical receivers Ri, Rj are active, the optical wireless communication transceiver Si in each of the nodes Ni is capable of simultaneously transmitting with a wide angle of transmitted light to 3/5 or more optical wireless communication transceivers Sj in the other n adjacent nodes Nj when all of its node and n adjacent nodes Nj satisfy the conditions of (1) to (3) and is capable of simultaneously receiving wide angle of transmitted light from 3/5 or more optical wireless communication transceivers Sj in the other n adjacent nodes Nj, in each of the nodes Ni, the optical wireless communication transceiver Si includes a controller for format conversion of an input signal to a communication signal according to the network when the input signal is input from an input apparatus 12 in a node to which the input apparatus 12 is connected, and a controller Ci for format conversion of a communication signal relating to the network to an output signal when an output apparatus outputs the output signal from the optical wireless communication transceiver Si to the output apparatus 13 in a node to which the output apparatus 13 is connected.

Here, the network is not limited to the triangular network, as shown in FIG. 8. When applied to the real world, it is difficult to realize the arrangement of the nodes of the equilateral triangle network, as shown in FIG. 8. A margin is applied to the angle and distance as in the first embodiment. Further, the shape of the triangular, square, hexagonal mesh is not limited to the same shape, a variety of shapes may be mixed. In the mesh structure in which polygons having different angles are mixed, for example, triangular, square, and hexagonal meshes may be combined, or meshes having larger angles may be mixed. Although the communication path follows the network, since the light spreads, the light can reach the paths of the N1→N3 and the N1→N5. In such a case, the light in that direction is blocked by the mask in an optical transmitter Ti or an optical receiver Ri, and it may be addressed by such cutting process as noise since the amount of light is small even when the actual light comes.

With this configuration, since using an LED light source that emits light at a wide angle, it is possible to provide a network capable of communicating 1:n in the optical wireless mesh network. An organic EL light source may be used. Further, the LD light source may be emitted at a wide angle in combination with, for example, a diffusion medium. In addition, since the communication route control of the controller is excluded, the transmission characteristics of the optical wireless mesh network can be improved. In addition, since the number of detour routes can be increased compared with the conventional technology, it is possible to detour the link more reliably. In addition, since a triangular, square, or hexagonal network structure is used, an infinitely wide network can be constructed.

The optical wireless mesh network communication system A7, according to the third aspect of the present invention, for example, as shown in FIG. 15, includes the optical wireless mesh network communication system according to claim 1 or claim 2 partially and is a wide-area communication system.

Here, when the network is connected to the network according to the first aspect or the second aspect, if at least two bridging paths are formed, a detour can be secured. With this configuration, it is possible to expand the network indefinitely.

In the optical wireless mesh network communication system A1 according to the fourth aspect of the present invention, in any one of the first to third aspects, the optical receiver Ri has a photodiode (hereinafter also referred to as "PD"), a resistor and a capacitor connected to the downstream side in the electric current flow direction of the PD, the optical receiver Ri has a peak of a light receiving wavelength set to a wavelength shorter than the wavelength of ambient light, a function of performing a multiplication function in response to the energy of an incident photon unit. a function of not accepting the next photon until one photon enters and the multiplication function is restored, when a voltage is applied between the terminals of the PD, a free carrier in the PD is activated, when the photon enters the PD in such a state, electrons are multiplied in the PD, electric current by the multiplied electrons is output. The optical receiver, which is a photon detection receiver having a device, is capable to detect an alternating electric current component corresponding to the acceleration fluctuation of the photon passing through the capacitor from the output current as a signal is used. With this configuration, high speed optical wireless communication becomes possible because a photon detection receiver is used.

Optical wireless mesh network communication system A1 according to a fifth aspect of the present invention, in any one of the first to fourth aspects, for example, as shown in FIG. 9, the angle of the transmission direction of the optical transmitter Ti and the angle of the reception direction of the optical receiver Ri is a wide angle, a plurality of optical transmitters Ti are combined to form the transmitting portion of the optical wireless transceivers when the other n nodes do not fall within the angle of the transmitting direction, and a plurality of optical receivers Ri are combined to form the receiving portion of the optical wireless transceiver when the other n nodes do not fall within the angle of the receiving direction.

Here, the optical wireless communication transceiver Si is constructed by combining a plurality of optical transmitters Ti and a plurality of optical receivers Ri in one node. Although an example in which three sets, four sets of optical transmitters Ti and optical receivers Ri are combined is described in the description, two sets, or five or more sets may be used.

With this configuration, it is possible to cover a wide emission angle or a wide light receiving angle.

In the optical wireless mesh network communication system A1 according to the sixth aspect of the present invention, in any one of the first to fifth aspects, for example, as shown in FIG. 1, in each of the nodes Ni, some of the optical wireless communication transceivers Si have a controller Ci and some do not have, the proportion of the nodes having controller Ci is 50% or less, and the controller Ci do not perform routing processing and performs remote control of the optical wireless communication transceivers Si in the nodes having no controller Ci in addition to control of the optical wireless communication transceiver Si in its own node.

Here, the ratio of those having a controller is set to 50% or less, but is more preferably 30% or less, and still more preferably 20% or less.

With this configuration, since the controller Ci does not perform routing processing, the processing time in the node can be shortened. The transmission characteristics of the optical wireless mesh network can be expected to be improved.

In the optical wireless mesh network communication system A1 according to the seventh aspect of the present invention, in any one of the first to sixth aspects, for example, as shown in FIG. 1, in the optical wireless communication transceiver Si in each node, if the optical transmitter Ti emits a signal, the controller Ci deactivates the optical receiver Ri immediately before and activates after a predetermined period has elapsed.

Here, the controller may be in its own node. If there is no controller in its own node, it may be remotely controlled by the controller of another node.

With such a configuration, it is possible to cut off a signal to be input reciprocally between two nodes or a signal to be input bypassing a large number of nodes, and it is possible to prevent congestion of communication.

Optical wireless mesh network communication system A1 according to the eighth aspect of the present invention (see FIG. 1), in any one of the first to seventh aspects, the value of the light receiving signal in each said node Ni is obtained by comparing the amount of light received by combining the signals from the other nodes Ni with the reference value, an outgoing signal from the optical transmitter Ti in each said node Ni is transmitted at a uniform predetermined amount of light.

Here, the reference value is determined based on, for example, past accumulated data.

Further, there may be a plurality of unified predetermined light amounts depending on the situation. The predetermined amount of light is determined to reach at least all of the opposite nodes.

With this configuration, since the optical transmitter Ti is transmitted at a predetermined amount of light unified, it is possible to suppress the attenuation of the signal due to the node.

In the optical wireless mesh network communication system, according to the ninth aspect of the present invention, in any one of the first to eighth aspects, multiple communication is employed for communication between the optical wireless communication transceivers Si.

Here, for example, the multiplexing communication is performed by combining a TDM (Time Division Multiplex) method and FDM (Frequency Division Multiplex)/WDM (Wavelength Division Multiplex) method by a plurality of optical wireless communication transceivers Si.

With this configuration, by using multiplexing, signals can be transmitted in parallel, and the transmission time can be shortened.

In the optical wireless mesh network communication system according to the tenth aspect of the present invention, in any one of the first to ninth aspects, the signal of communication between the optical wireless communication transceivers Si are represented by multiple values.

Here, as a method of multi-level communication, for example, DPSK (Differential Phase-Shift Keying), DQPSK (Differential Quadrature Phase-Shift Keying), coherent QAM (Quadrature Amplitude Modulation), OFDM (Optical Frequency Division Multiplexing), Wavelet OFDM, can be applied PPM (Pulse Position Modulation) or the like.

With such a configuration, when multi-level communication is performed, a signal of a plurality of bits can be transmitted by one optical pulse. The transmission time can be significantly shortened.

Optical wireless mesh network communication system A1 according to the eleventh aspect of the present invention (see FIG. 1), in any one of the first to tenth aspects, for example, as shown in FIG. 1, the controller Ci compares the measurable amount of light received in each of the nodes Ni with the accumulated data at the time of abnormality to determine that a failure has occurred in the same or similar case.

Here, the data at the time of an error may be stored in the storage apparatus attached to the controller or may be stored in the storage apparatus of the automatic configuration system that manages the entire controller. Further, the similarity means a case where the value is closer to 4:6 or less than the value one above or one below, for example, including a case where the value is binary or multi-level. A closer case of 3:7 or less is more preferable.

With this configuration, it is possible to determine the occurrence of a failure. Therefore, it is possible to cope with the problem by, for example, deactivating the optical receiver Ri and the optical transmitter Ti of the path of the failure.

In the optical wireless mesh network communication system A1 according to the twelfth aspect of the present invention, in any one of the first to eleventh aspects, the controller Ci determines the location of the fault by tracking the path of the abnormal data.

Here, for example, in the node to which the controller is attached, the light quantity of the node to which each controller is connected in the normal case and in the case where various faults exist is recorded. When a fault occurs, the light quantity data of the node to which each controller is attached is compared with the recorded data, thereby specifying the faulty place.

With such a configuration, since the location of the failure can be grasped, it is linked to the repair, such as the replacement of the light emitting component, for example.

In the optical wireless mesh network communication systems A8 to A10 according to the thirteenth aspect of the present invention, in any one of the first to twelfth aspects, for example, as shown in FIG. 16A, an optical wireless communication transceiver Si (see FIG. 2) installed in any node N is configured to be movable.

With this configuration, even in a network having a movable optical communication transmitting/receiving apparatus, a network capable of 1:n communication can be provided. Further, it is possible to improve the transmission characteristics of the optical wireless mesh network and to bypass the link more reliably.

An optical wireless communication transceiver Si according to the fourteenth aspect of the present invention, is, for example, as shown in FIG. 2, an optical wireless communication transceiver Si having an optical transmitter Ti, an optical receiver Ri, and an optical fiber cable or a coaxial cable for transmitting a signal received by the optical receiver Ri to the optical transmitter Ti.

It is possible to simultaneously transmit a wide angle of transmission light to the optical wireless communication transceiver Si in the other plurality of nodes Ni and simultaneously receive a wide angle of transmission light from the optical wireless communication transceivers Si in the other plurality of nodes Ni, in a node Ni to which an input apparatus 12 (see FIG. 8) is connected, routing control is not required, and a controller Ci for converting an input signal to a communication signal related to the network when an input signal is input from the input apparatus 12, is installed, and, in a node Ni to which an output apparatus 13 (see FIG. 8) is connected, routing control is not required, and a controller Ci for converting a communication signal related to the network to an output signal when the output signal is output from the optical wireless communication transceiver Si to the output apparatus 13, is installed, and in a node to which an input apparatus 12 or an output apparatus 13 is not connected, a controller for routing control is not required.

In this case, routing control does not need to be performed in each node because the transmission light and the reception light perform 1:n communication at a wide angle. As a result, the load on the controller Ci in each node is significantly reduced, and the processing speed is increased. For example, the processing of 0.2 ms can be shortened to 5 ns. With such a configuration, the controller does not have to perform routine processing, the processing time in each node is shortened, and the transmission characteristics of the optical wireless mesh network can be significantly improved. This is an excellent effect of the optical wireless communication transceiver according to the present invention.

Effect of the Invention

According to the present invention, a network capable of 1:n communication in an optical wireless mesh network can be provided. Further, it is possible to improve the transmission characteristics of the optical wireless mesh network and to bypass the link more reliably.

EMBODIMENTS OF THE PRESENT INVENTION

Figure 1:
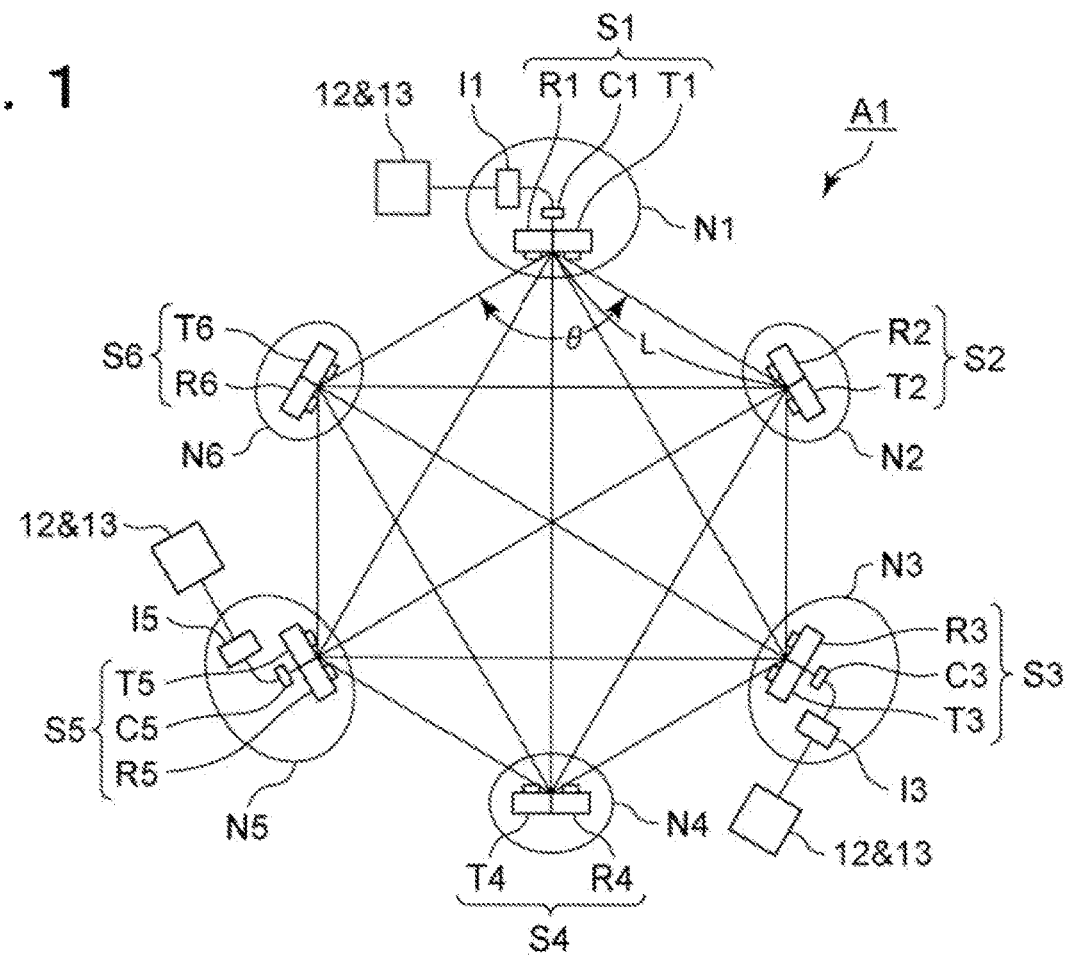
FIG. 1 is a diagram showing a configuration example of an optical wireless mesh network communication system A1 according to a first embodiment.

Embodiments of the present invention will be described below with reference to the drawings. In the drawings, the same or corresponding parts are denoted by the same or similar reference numerals, and a repetitive description thereof is omitted.

Example 1

In this embodiment, an example will be described in which an optical wireless mesh network communication system A1 is composed of n+1 nodes, each node is provided with an optical wireless communication transceiver, and an optical wireless communication transceiver in any node is capable of communicating with the optical wireless communication transceivers in all (n) of other nodes. An example of a hexagonal network (6 nodes, n=5 communication partner nodes) will be described as a typical example.

FIG. 1 shows an example of a network configuration of an optical wireless mesh network communication system A1 according to the present embodiment. The network is hexagonal and the nodes are located at each vertex of the hexagon. Each node Ni (i=1 to 6) is provided with an optical wireless communication transceiver Si. The optical wireless communication transceiver Si has an optical receiver Ri and an optical transmitter Ti. In a node Ni, which connects to another network, where there is input/output apparatus 12 & 13 (including either input apparatus 12 or output apparatus 13), the optical wireless communication transceiver Si further comprises a controller Ci and an interface Ii. Here, it is assumed that the input/output apparatus 12 & 13 and the controller are arranged in the nodes N1, N3, and N5, and are connected to other networks. It should be noted that a spare controller may also be arranged in a node which does not have the input/output apparatus 12 & 13 (here, in the case where neither the input apparatus 12 nor the output apparatus 13 is present) and which does not become a connection part with another network.

Light is used for communication. Here mainly handles visible light communication, but light having a bandwidth other than visible light such as ultraviolet light-near-ultraviolet light, infrared light or near-infrared light may be used. The transmitter Ti has a light emitting device that emits visible light such as a LED, an organic EL. Further, a LD light source may be emitted at a wide angle, for example, in combination with a diffusion medium. At present, LED is considered to be practical. For example, a high-brightness, organic EL apparatus of about 18.5 million Cd/m$^2$ has been developed at an applied voltage of about 35 V (see "Development of Ultra High-Brightness Organic EL" by Hirohusa Shirai et al., Project Results No. 14 of Nagano-Ueda Regional Intelligent Cluster Creation Project, published Feb. 16, 2006). Since the LED can be modulated at high speed, it is expected to be applied to high speed, large-capacity communications in the future.

The direction of transmission of light from optical transmitter Ti is a wide angle θ (e.g., 120 degrees) and includes the direction of all other nodes. Therefore, it is receivable by the optical receiver Ri in all other nodes. The optical receiver Ri has a light receiving device such as a photodiode. Preferably, an avalanche photodiode (hereinafter also referred to as "APD") and a resistor R and a capacitor C connected to the downstream side in the flow direction of the electric current from the APD constitute a light receiving device. And the APD operates in a linear mode in which the peak of the light receiving wavelength is set to a wavelength shorter than environmental light and the APD has a constant multiplication factor with respect to the energy of incident photons (see Japanese Patent Application No. 2018-105165 (unpublished)).

The direction of light reception is a wide angle θ (e.g., 120 degrees) and includes the direction of all other nodes. Thus, it is possible to receive light from the optical transmitters Ti in all other nodes. The distance between neighboring nodes (here, the distance of one side of a hexagon) is, for example, 20 m. Visible-light communication is mainly used for short-distance communication, but it is possible at the reach of visibility, for example 1 km.

Figure 2:
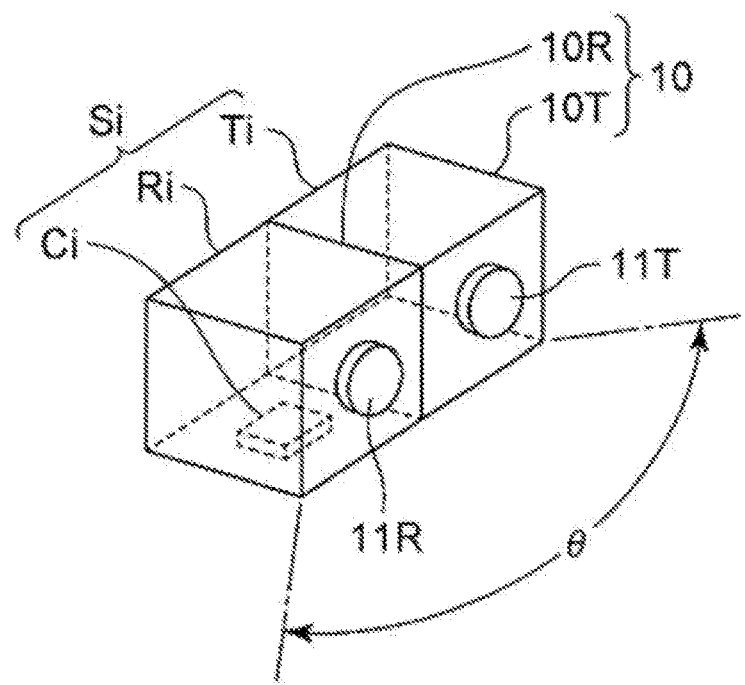
FIG. 2 is a diagram illustrating a configuration example of an optical wireless communication transceiver according to a first embodiment.

FIG. 2 shows a configuration example of an optical wireless communication transceiver according to the present embodiment. The optical receiver Ri is housed in an opaque plastic housing 10R, e.g., 3-10 cm$^3$, and the optical transmitter Ti is housed in an opaque plastic housing 10T, e.g., 3-10 cm$^3$. Light emitting devices, light receiving devices, respectively, are incorporated in cylindrical optical components 11T, 11R protruding from housing 10T,10R to the outside. Light emitting devices, light receiving devices, respectively, are incorporated in cylindrical optical components 11T, 11R protruding from housing 10T,10R to the outside. Optical components 11T, 11R have an opening for emitting and receiving light outward, the light receiving angle θ, the emission angle θ are, for example, 120 degrees at a wide angle. Housing 10T and the housing 10R are horizontally integrated so that the light emitting direction and the light receiving direction coincide, configured as an integral housing 10. In this case, the entire or a part of the boundary wall between the housing 10T and the housing 10R may be removed. Further, in any of the nodes, since the sending partner node to which the optical transmitter transmits and the receiving partner node from which the optical receiver receives may occur different, the light emitting direction of the optical transmitter Ti and the light receiving direction of the optical receiver Ri may not be matched, it may be configured to separate the housing 10T and the housing 10R.

Incidentally, as the optical receivers Ri (i is a positive integral number), the light receiving apparatus according to Japanese Patent Application 2018-105165 is preferred. That is, the light receiving device has a photodiode (hereinafter also referred to as "PD") and a resistor R and a capacitor C connected on the downstream side in the electric current flow direction from the PD. The PD has a peak of a light receiving wavelength set to a wavelength shorter than the wavelength of ambient light, and has a function of performing a multiplication function in response to the energy of an incident photon unit. Moreover, it has a function of not accepting the next photon until one photon enters and the multiplication function is restored. When photon enters the PD in such a state, electrons are multiplied in the PD, electric current by the multiplied electrons is output. When photon enters the PD in such a state, electrons are multiplied in the PD, electric current by the multiplied electrons is output. It is possible to detect alternating electric current component corresponding to the acceleration fluctuation of the photon passing through the capacitor from the output current as a signal. Such an optical receiver is referred to as a photon detection receiver, it is preferable to use a photon detection receiver as the optical receiver Ri of the present invention.

Figure 3:
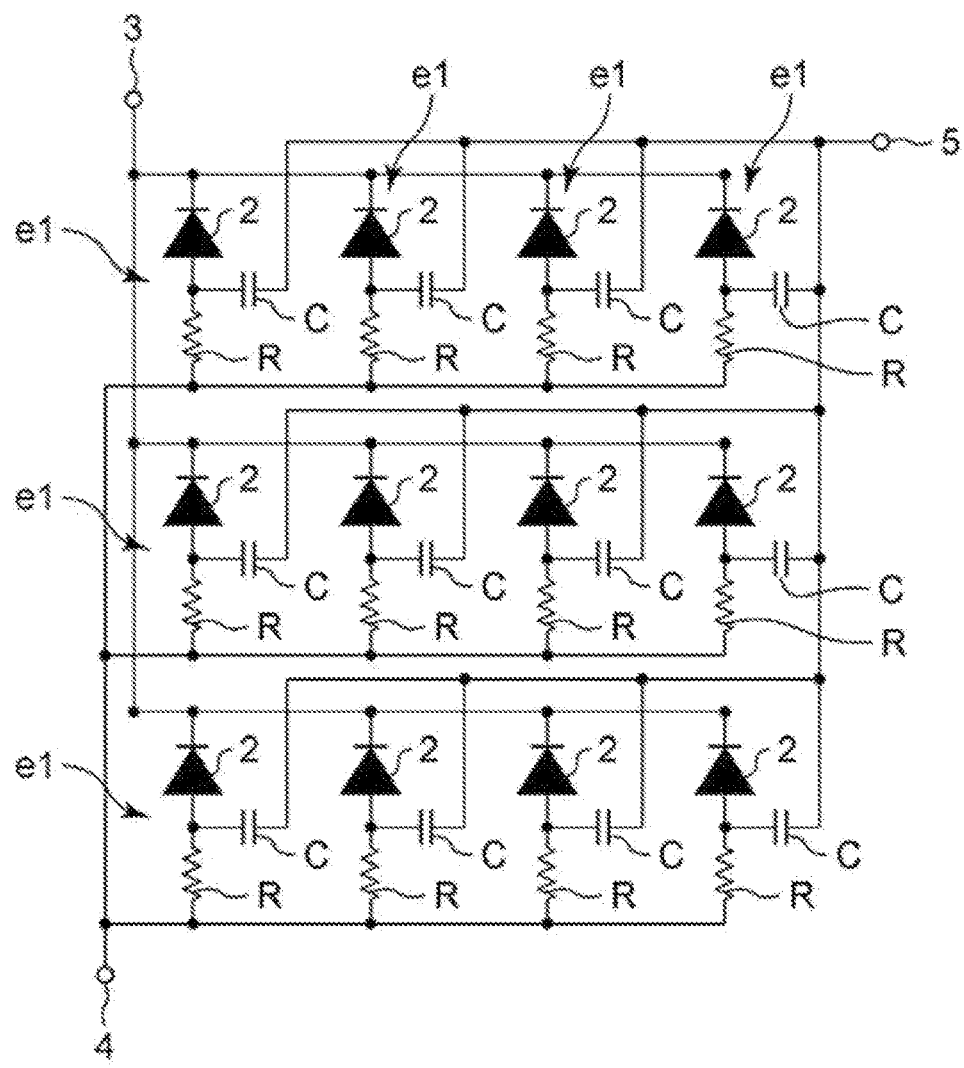
FIG. 3 is a diagram showing an example of a light receiving circuit in which a plurality of light receiving devices are connected in parallel.

FIG. 3 shows an example of a light receiving circuit in which a plurality of light receiving devices are connected in parallel. In light receiving circuit, a plurality of light receiving devices el are arranged in a matrix array. Light receiving device el has an APD, and a resistor R and a capacitor C connected to the downstream side in the electric current flow direction of the APD. Terminals 3 and 4 are provided on both sides of the APD by applying a voltage between the terminals 3 and 4, to operate the light receiving device el in a linear mode. Terminal 3 is connected to the n-region of each APD, the terminal 4 is connected via a respective individual resistor R to the p-region of each APD. Each capacitor C is connected to the same output terminal 5. When a voltage is applied between the terminals 3 and 4 so that the APDs operate in a linear mode, the sum of the electric currents output from the matrix array of APD 2 receiving the photons is output from the terminal 5 as electric current signal.

Although it is preferable to use an APD as a light receiving device, if PD has the next three functions, function that the peak of a light receiving wavelength is set to a wavelength shorter than the wavelength of ambient light, function to response to the energy of the incident photon unit, function of not accepting the next photon until one photon enters and the multiplication function is restored, the type of PD is not limited. The APD constituting the light receiving device, even when a plurality of photons are incident, and outputs an electric current by causing accepted avalanche breakdown only one photon, the multiplication function becomes zero and has a characteristic that does not accept the next photon until 100% recovery. Moreover, the peak of the light receiving wavelength is set to 405 to 470 nm. The light receiving device thus received photons, in a Geiger mode in which a reverse bias voltage equal to or higher than the APD breakdown voltage is applied between its terminals, when photons having a wavelength of 350 to 470 nm are incident on the APD, a large electric current, which is a saturation output unique to the APD, is output. In such a Geiger mode, when a photon is incident, a large electric current is output by Geiger discharge, but once Geiger discharge begins, the electric current continues to be output until the electric field inside the APD is eliminated.

When the APD having such characteristics is used in the Geiger mode, a large electric current is output. However, since the multiplication function is not restored until the large electric current reaches zero, it takes time until the multiplication function is restored by 100%, and therefore, it is a problem that high speed communication of several hundred MHz or more cannot be performed. Moreover, since the downstream of APD2 is provided with a quenching resistor R as a large electric current countermeasure for APD protection, the fall time of the pulse-shaped electric current waveform is increased by the amount of the resistor. The longer the fall time of the pulse-shaped electric current waveform, the longer the time until the multiplication function of the APD recovers 100%. For example, 250 ns is reached. If this time becomes longer, large-capacity communication requiring response of several hundred MHz becomes impossible. For large-capacity communications with frequencies between 200 and 500 MHz, the incident velocity of photons must be incomparably fast compared to that of Geiger measurements counting the number of photons. Therefore, when the APD is operated in the Geiger mode, high capacity communication of several hundred MHz or more cannot be performed.

Figure 4:
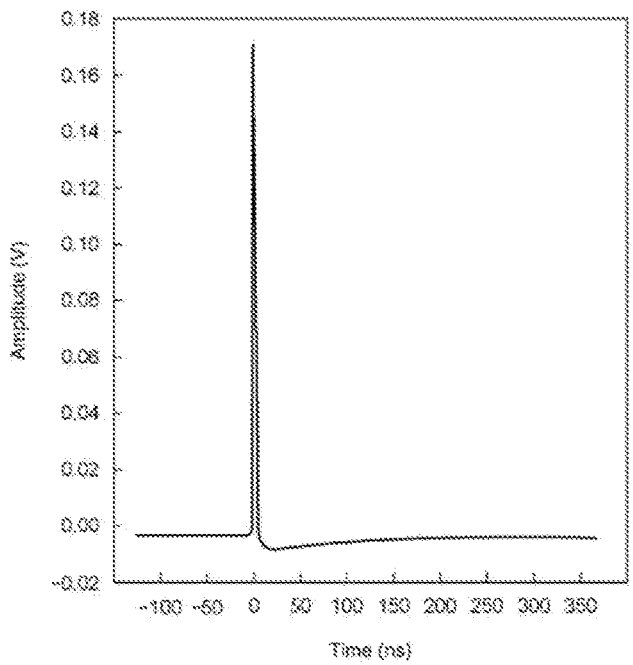
FIG. 4 is a diagram showing an example of a rise and fall time of the pulse shape waveform of the voltage signal based on the electric current flowing through the capacitor.

FIG. 4 shows an example of the rise and fall time of the pulse shape waveform of the voltage signal based on the electric current flowing through the capacitor C. The present inventor has inferred that while the electric current output from PD and APD2 is in principle direct electric current, there is an alternating current component in the electric current corresponding to the accelerated fluctuation of the photon. In addition, in FIG. 3, the electric direct current component of the electric current output from the PD or APD2 is consumed in the resistor R, an alternating component corresponding to the accelerated fluctuation of the photon flows into the capacitor C, it is possible to extract the electric current flowing through the capacitor C as an electrical signal from the terminal 5. Then, since the smaller the capacitance of the capacitor C is, the shorter the time constant can be, it is possible to shorten the rise time and fall time of the signal. In FIG. 4, a sum of the rise time and the fall time of about 5 ns is obtained.

Furthermore, between the pair of terminals 3 and 4, the reverse bias voltage of the linear mode in a range smaller than the reverse bias voltage of the Geiger mode is applied, PD or APD2 works in a linear mode in which the multiplication factor of electrons becomes constant in response to the input energy of one incident photon. For example, even if an APD2 is used as a PD, the PD is operated in a linear mode instead of the Geiger mode so that the PD can cope with large-capacity communication. Since it is possible to shorten the rise time and the fall time of the signal waveform, the pulse waveform of the signal that can be taken out from the capacitor C as shown in FIG. 4 becomes steep, it becomes possible to large-capacity communication of several hundred MHz or more because the response speed becomes faster.

Further, since the peak of the light receiving wavelength is also shorter than the wavelength of the ambient light, it is possible to distinguish between an electrical signal having large energy of one photon and noise based on ambient light having small energy of one photon. In addition, the light at 405-470 nm includes near ultraviolet to blue light. Light in the blue system is more distinguishable from ambient light because of the large energy of photons. Further, when the light receiving device is used as the light receiving surface by arranging the light receiving device in an array, a large output signal can be obtained by increasing the light receiving device. Further, when the light receiving device is used as the light receiving surface by arranging the light receiving device in an array, a large output signal can be obtained by increasing the light receiving device. Further, it is possible to increase an aperture ratio of the light receiving surface when the resistor and the capacitor is provided on the back side of the light receiving surface, as a result it is possible to improve the light receiving efficiency. Further, since the reverse bias voltage of the linear mode is smaller than one of the Geiger mode, large electric current such as APD specific saturation output is never output.

Figure 5A:
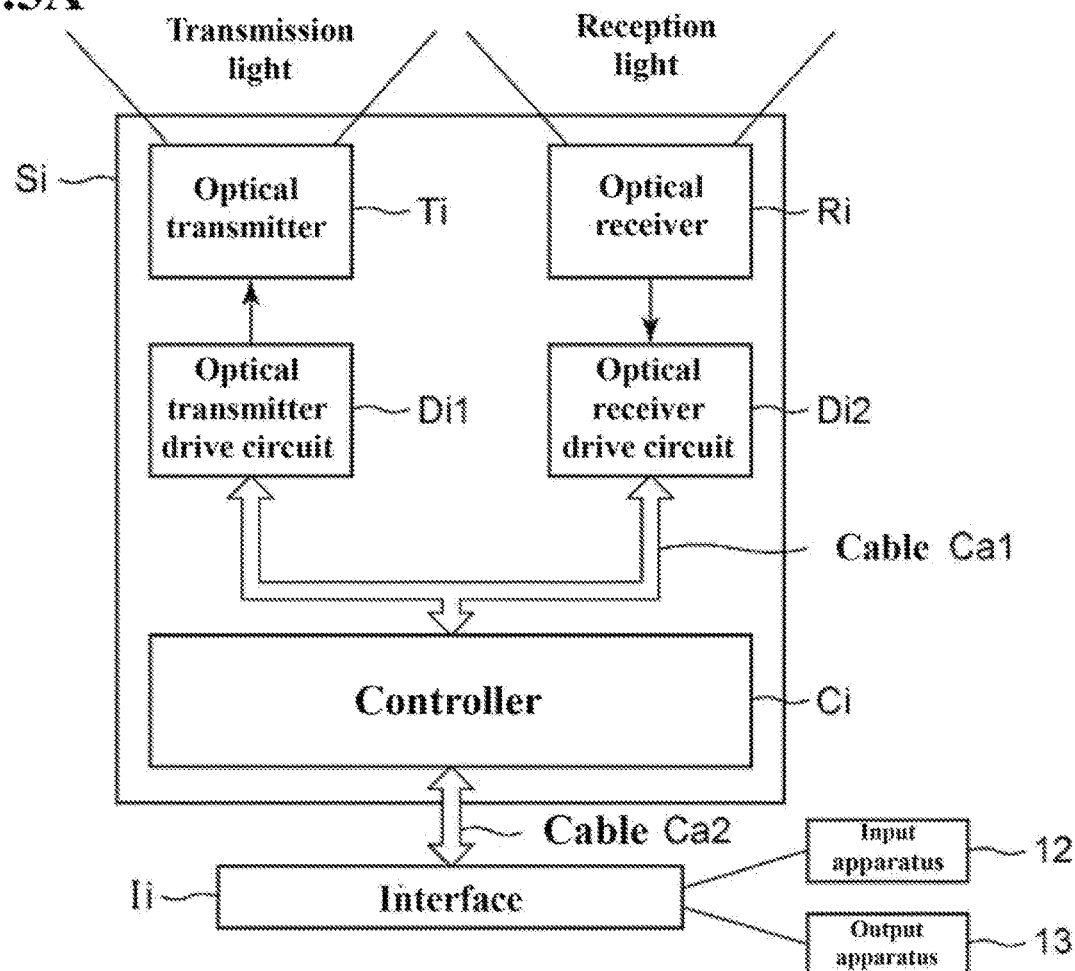
FIG. 5A is a diagram showing a configuration example of an optical wireless communication transceiver having a controller in the input and output nodes.
Figure 5B:
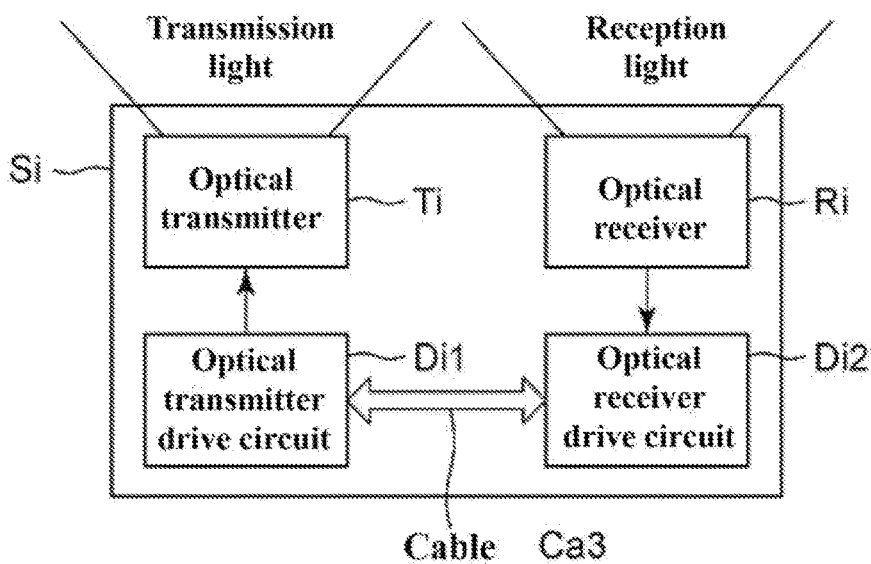
FIG. 5B is a diagram showing a configuration example of an optical wireless communication transceiver without a controller other than the input-output node.

FIGS. 5A and 5B show examples of the configuration of an optical wireless communication transceiver. FIG. 5A shows a configuration example of an optical wireless communication transceiver having a controller in an input/output node (a node having an input apparatus 12 or an output apparatus 13) and FIG. 5B shows a configuration example of an optical wireless communication transceiver having no controller in a node other than an input/output node. The optical wireless communication transceiver Si is constructed by combining an optical receiver Ri and an optical transmitter Ti. In addition, an optical receiver drive circuit Di2 and an optical transmitter drive circuit Di1, a cable (an optical fiber cable or a coaxial cable for transmitting a signal received by the optical receiver Ri to the optical transmitter Ti) Ca1~Ca3. Further, as shown in FIG. 5A, in the input/output nodes, the optical receiver Ri and the optical transmitter Ti are controlled. Further, via the interface Ii, provided with a controller Ci for converting the communication signal relating to the network into an input signal and/or an output signal. Such a controller Ci does not perform routing processing. Further, as illustrated in FIG. 5B, a controller is not required for a node other than an input/output node. That is, since the optical transmitter Ti capable of transmitting the wide angle light and the optical receiver Ri capable of receiving the wide angle light are used, the routing process becomes unnecessary. Therefore, the time required for routing processing can be saved in each node. For example, the processing of 0.2 ms can be shortened to 5 ns.

As shown in FIG. 4, as an optical transmitter Ti used in combination with the optical receiver Ri capable of high speed raising and high speed falling, a high speed responsive optical transmitter Ti is desired. Those having a response characteristic of 1 to 10 ns (100 MHz to 1 GHz) are desirable, for example, in an organic EL, a response of 100 MHz to 1 GHz is expected. In addition, although a wide angle transmission light can be formed by combining a diffusing medium with a laser light source, a response of 1 to 10 GHz is also expected for the laser beam.

Referring to FIG. 5A, for example, a signal is received by the optical receiver Ri and is photoelectrically converted and A/D converted. In the output node, the signal is sent to the interface Ii, demodulated and format-converted by the controller Ci, and output by the output apparatus 13. Further, in the relay node (also the same when performing only relay in the input/output node), the A/D converted signal is sent to the optical transmitter Ti, for example, through an optical fiber cable or a coaxial cable Ca1, D/A converted, and drives the light emitting device to emit light. Further, in the input node, the signal input from the input apparatus 12, converted and modulated by the controller Ci is sent to the optical transmitter Ti by an optical fiber cable or a coaxial cable Ca1, to drive the light emitting device to emit light. Thus, the controller Ci is arranged in the input/output node to perform format conversion, etc., but since the controller is not arranged in the relay node and there is no routing processing of the controller even if there is, the delay in the node is at most about 0.2 ns, and processing in the entire network is high speed.

Controller Ci is constituted on, for example, a semiconductor substrate of 40 mm square, and is installed on one of the bottom surface of the housing 10R or the housing 10T (inside the housing). The controller Ci is connected with the optical receiver Ri and the optical transmitter Ti by an electrical code to control the optical receiver Ri and the optical transmitter Ti. The controller is also connected to the interface Ii at the connection part with the input/output apparatus 12&13 or other network to convert the input signal from the input apparatus 12 or other network to an optical communication signal, and also to convert the optical communication signal to an output signal to the output apparatus 13 or other network. Further, the controller makes the optical receiver R1 to receive together with the attenuated optical signals from the optical transmitter Ti in the plurality of other nodes and makes the optical transmitter Ti to transmit to the optical receiver Ri in the other node with an optical signal of a predetermined amount of light (power). Further, it controls activation or inactivation, etc. of the optical receiver Ri and the optical transmitter Ti. The predetermined amount of light is determined, for example, at the time of design.

In addition to input from the input apparatus 12 and output to the output apparatus 13, I/O nodes can be remotely controlled over other networks by connecting to an Ethernet or Wi-Fi. In addition, by connecting to the in-house LAN, it becomes possible to extend to the network including servers and terminals in the in-house.

Figure 6:
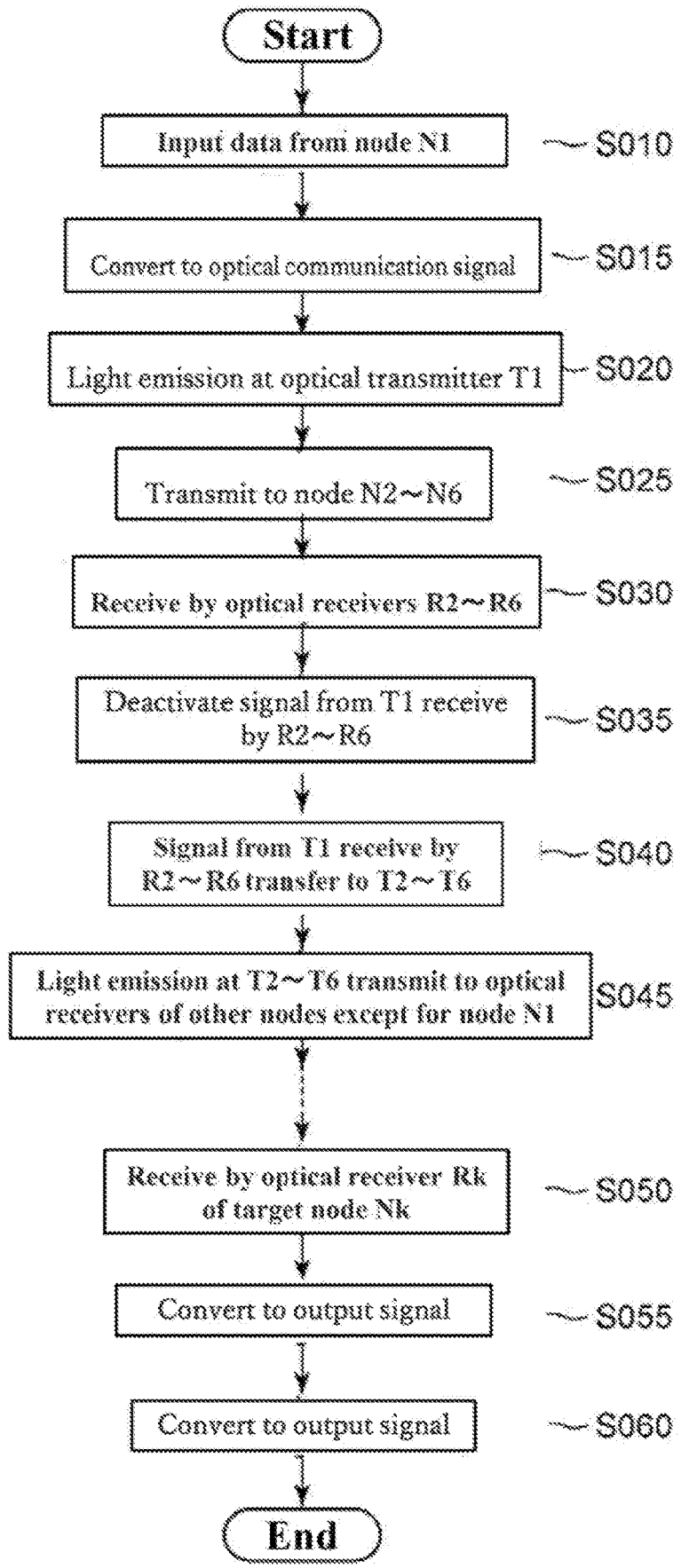
FIG. 6 is a diagram showing an example of a flow chart of communication of a network in a healthy state in an optical wireless mesh network communication system A1.

FIG. 6 shows an example of a flow chart of communication in the optical wireless mesh network communication system A1 in a healthy state that no failure or no noise occurs according to the present embodiment. First, it is assumed that data is input from the node N1 (S010). Then, the input signal is converted into an optical communication signal conforming to the protocol of optical communication by the controller C1 (S015). When the signal conversion is checked and corrected, an current check method and an error correction method are used. Next, the light emitting apparatus is caused to emit light in the optical transmitter T1 (S020). To emit a predetermined amount of light, for example, the light emitting device is applied a voltage. Since it may be installed in locations without commercial power, it is desirable to determine the amount of light emitted and the applied voltage so that the battery can last as long as it is detectable by all other nodes. The emitted light spreads over a wide angle (e.g. 120 degrees) and is sent to the other nodes N2-N6 (S025). The content of the transmitted signal is the same for each node. Next, in each node N2-N6, an optical signal is received at the optical receivers R2-R6 (S030). The content of the received signal is also the same for each node.

Next, the optical receivers R2 to R6 deactivate the reception from the source node N1 (S035). Then, in the respective nodes N2 to N6, the signals received by the optical receivers R2 to R6 are transferred to the optical transmitters T2 to T6 (S040). In the transfer process, first, the received signal at the optical receiver is converted from an optical signal to an electrical signal, and then converted from the electrical signal to an optical signal for transmission. Then, the optical transmitters T2 to T6 make the light emitting devices to emit and transmitted to the optical receivers Ri in the other nodes (S045). Here, the reason why the reception from the sender node N1 is deactivated in the optical receivers R2 to R6 is that, for example, if it is kept active at the node N2, the exchange of the signal between the node N1 and the node N2 persists, and the optical signal entering from N1 to N2 through the other node is also mixed, causing convergence. That is, it is deactivated to prevent such convergence. Then, (S035)~(S045) is repeated in propagating signals in the network. In the output node, transmission to another node is deactivated. This is also to prevent convergence.

By repeating the above, the optical signal is received by the optical receiver Rk (k is a positive integer) in the destination node Nk (k is a positive integer) at some time (S050). Here, assuming that the input node is N1 and the target node (output node) Nk is N3, the optical communication path of N1→N3 includes, N1→N2→N3, N1→N4→N3, N1→N5→N3, N1→N6→N3, N1→N2→N4→N3 (or N1→N4→N2→N3), N1→N2→N5→N3 (or N1→N5→N2→N3), N1→N2→N6→N3 (or N1→N6→N2→N3), N1→N4→N5→N3 (or N1→N5→N4→N3), N1→N4→N6→N3 (or N1→N6→N4→N3), N1→N5→N6→N3 (or N1→N6→N5→N3), and the like in addition to N1→N3. Through these paths, the optical signal reaches the optical receiver Rk in the target node Nk. In the target node Nk, the optical receiver Rk receives light transmitted from the optical transmitters Ti in all other nodes. Checking the received light signal will be described later. In the target node, the received signal is converted from an optical signal to an output signal (S055). When the signal conversion is checked and corrected, a current check method and an error correction method are used. The data is then output to the output apparatus (S060).

In conventional optical wireless communication, in a lattice network, communication from a transmitting node to a receiving node is limited to 1:1 transmission from one node to another. In this embodiment, transmission from one transmitting node to a plurality of other nodes is performed and received by a plurality of other nodes. In addition, the transmission is performed from a plurality of nodes to one receiving node, and is received by the optical receiver of one node. That is, 1:n communication is performed.

By such 1:n communication, the following effects (a) and (b) are obtained.

(a) Since a multi-route communication path can be formed, even if an obstacle exists in the middle of the communication path, an optical signal can be transmitted to a target node via a detour path.

(b) In conventional optical wireless communication, a hopping method has been adopted for relaying each node. Incidentally, in the hopping method, it takes about 0.2 ms for the processing time of the routing control and the like in each node, and a delay of 1 ms occurs through, for example, five nodes. On the other hand, in the optical communication of the present embodiment, since the routine processing is not performed in the controller processing, the transmission can be performed in 5 ns. Routing control does not need to be performed in each node because the transmission light and the reception light perform 1:n communication at a wide angle. As a result, the load on the controller Ci in each node is greatly reduced, and the processing speed is increased. Further, in the conventional hopping system, attenuation of the amount of light is observed, and, for example, communication becomes impossible through five nodes, and the arrival distance of communication becomes about several hundred meters. On the other hand, in the optical communication of the present embodiment in each node, since the optical transmitter Ti emits light of a predetermined amount of light, there is no attenuation of the amount of light by passing through the node Ni. In the case where reception or transmission with a specific node is prohibited, a mask for blocking light in a specific direction may be provided in the optical receiver Ri or the optical transmitter Ti.

Figure 7A:
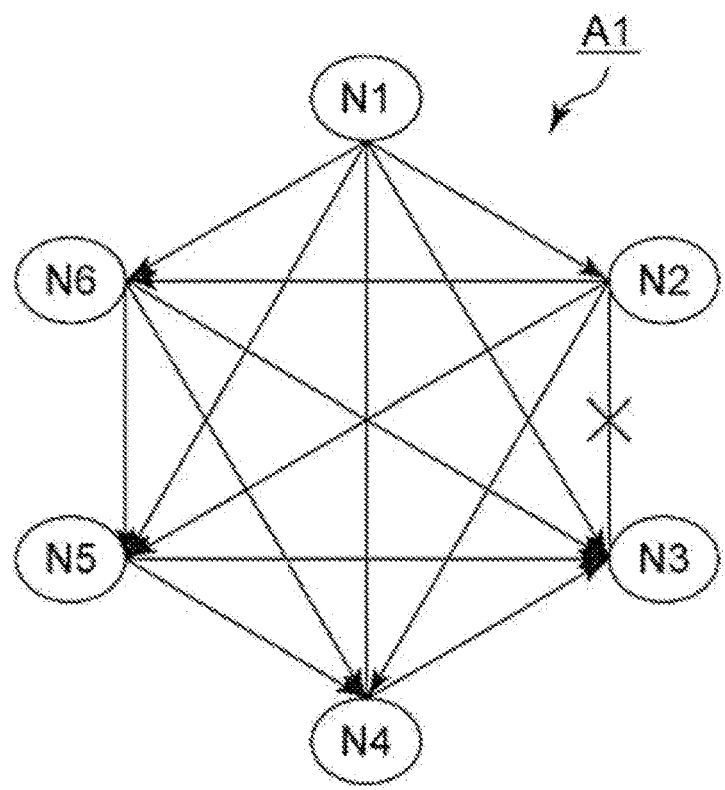
FIG. 7A is a diagram showing an example in which there is a failure in the communication path.
Figure 7B:
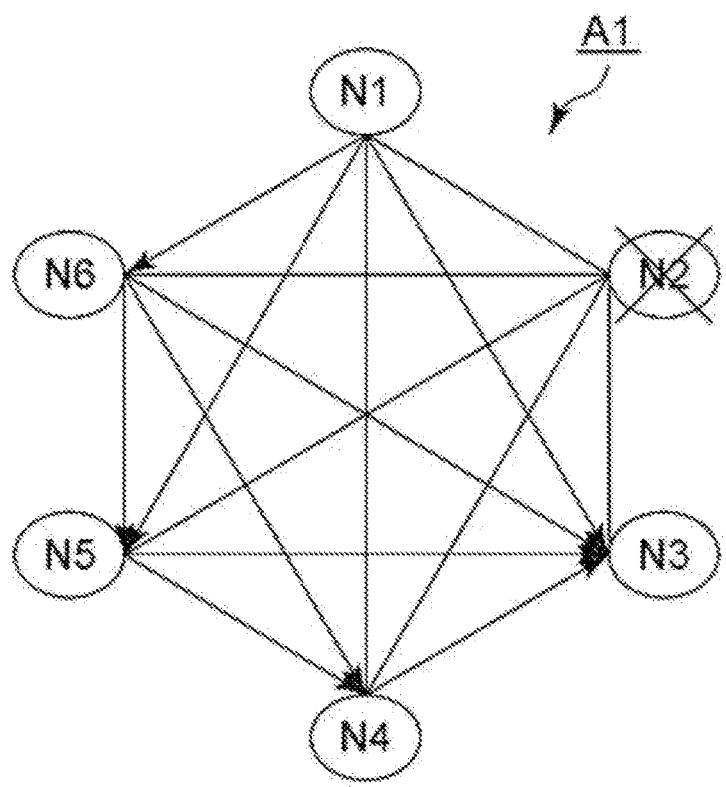
FIG. 7B is a diagram showing an example in which there is a failure in the node.

FIGS. 7A and 7B show examples in which there is a failure in the communication path. FIG. 7A shows an example in which there is a failure in the communication path, and FIG. 7B shows an example in which there is a failure in the node. That is, the effects (a) will be described with reference to FIGS. 7A and 7B.

In the illustrated FIG. 7A, if there is a fault between the path N2-N3, communication between N2-N3 is disabled. However, assuming that the input node is N1 and the target node (output node) Nk is N3, the optical communication path of N1→N3 can be paths such as N1→N4→N3, N1→N5→N3, N1→N6→IN3 (or N1→N5→N4→N3), N1→N4→N6→N3 (or N1→N6→N4→N3), N1→N5→N6→N3 (or N1→N6→N5→N3) in addition to N1→N3.

In the illustrated FIG. 7B, when the node N2 has a failure, communication via the node N2 is disabled. However, assuming that the input node is N1 and the target node (output node) Nk is N3, the optical communication path of N1→N3 can be paths such as N1→N4→N3, N1→N5→N3, N1→N6→IN3 (or N1→N5→N4→N3), N1→N4→N6→N3 (or N1→N6→N4→N3), N1→N5→N6→N3 (or N1→N6→N5→N3) in addition to N1→N3.

Thus, it can be understood that a plurality of communication paths are possible, and bypass communication is possible. In addition, since communication paths such as the N1→N3 and the N1→N5 other than the neighboring nodes having the network structures can be used, the detour can be increased, and the detour can be more reliably performed.

The AGC (Automated Gain Control) technique can then be applied to identify areas of impairment. For example, in the node provided with the controller, the light amount of each controller in the case of normal and various failures are recorded with node address, the time stamp information. When the failure occurs, by comparing the light amount data of each node provided with the controller with the recorded data, it is possible to identify the failure location.

The blockchain method is also applicable. For example, the transmission data from each node is transmitted with the identification code (or identification number) of the node. As a result, if a node different from the original transmission signal is found, it is specified as a failed node, an unauthorized connection path, or a failed path.

Next, the reception will be described. The optical receiver Ri in each node receives optical signals transmitted from a plurality of different nodes (n nodes). Here, noise or interference affects the signal of the optical receiver receiving the signal if the optical signal from one node is a different signal from the others. In such a case, the AGC method and the blockchain method can be applied in the same manner as the failure.

It is preferable to match the impedance of the optical receiver Ri, the optical transmitter Ti and the controller Ci (matched). Further, to match the 50Ω is good compatibility with the communication network of Wi-Fi and mobile phones, it is preferable because it can reduce the loss.

As described above, according to the present embodiment, a network capable of 1:n communication in an optical wireless mesh network can be provided. Further, it is possible to improve the transmission characteristics of the optical wireless mesh network and to bypass the link more reliably.

Example 2

In the present embodiment, an example will be described in which a network is a triangular network structure, and optical communication is performed between adjacent nodes. The network according to the present embodiment, is a triangular network structure in which the number of adjacent nodes is 3 to 6, and the number of communication partners is n=3 to 6.

Figure 8:
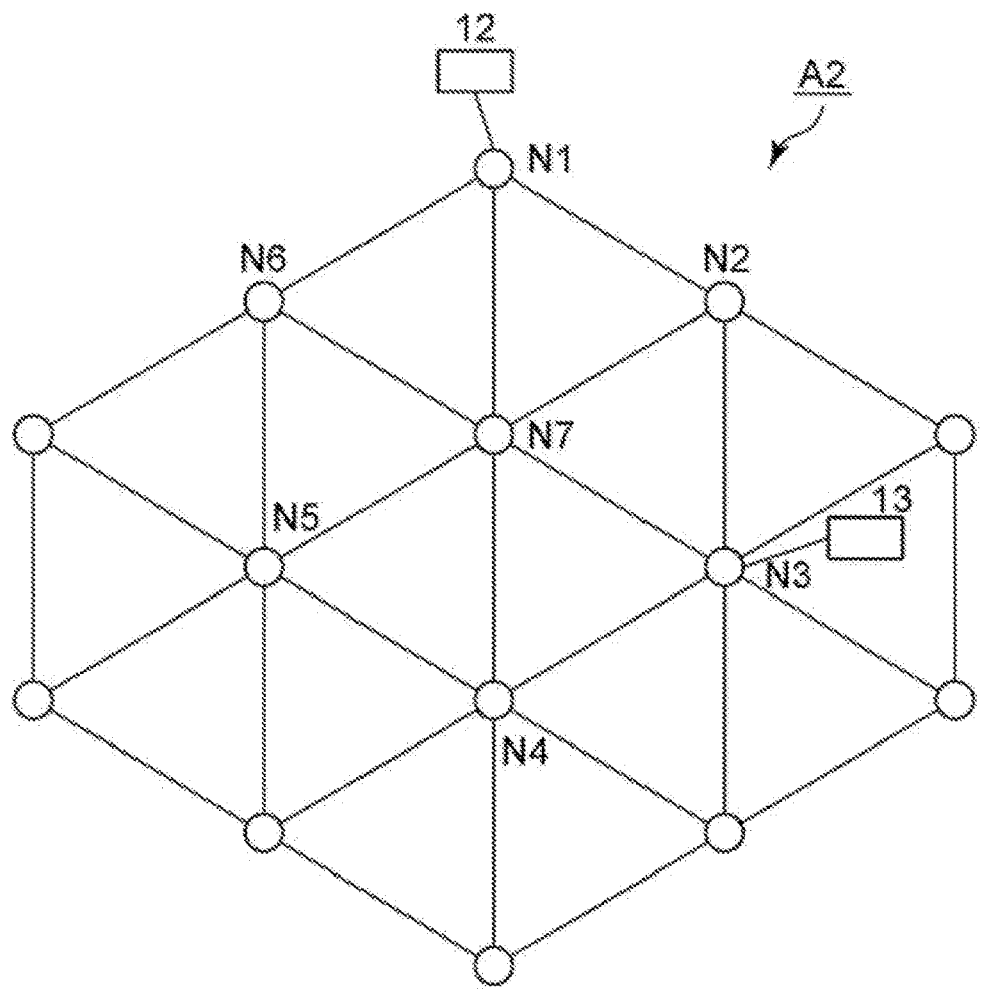
FIG. 8 is a diagram showing a configuration example of an optical wireless mesh network communication system A2 according to the second embodiment.

FIG. 8 shows an example of the network configuration of the optical wireless mesh network communication system A2 according to the present embodiment. N1 to N6 are in the same positional relationship as in the first embodiment, and a node N7 is arranged at the center thereof. An input apparatus 12 is connected to N 1, and an output apparatus 13 is connected to N3. Optical transmitter T1 in the node N1 (see FIG. 1) transmits an optical signal to the three adjacent nodes N2, N6, N7. Further, the optical receiver R1 in the node N1 (see FIG. 1) receives the optical signals from the three adjacent nodes N2, N6, N7. The optical wireless communication transceivers S2 and S6 in the nodes N2 and N6 transmit optical signals to four adjacent nodes and receive optical signals from the four adjacent nodes. The optical wireless communication transceivers S3-S5, S7 in the nodes N3-N5, N7 transmit optical signals to the six adjacent nodes and receive optical signals from the six adjacent nodes. For example, the optical wireless communication transceiver S7 transmits optical signals to the optical wireless communication transceivers S1 to S6 in the adjacent nodes N1 to N6, and receives optical signals from the optical wireless communication transceivers S1 to S6 in the adjacent nodes N1 to N6. The functions of the input apparatus 12 and the output apparatus 13 are the same as those of the first embodiment.

Assume that the input node is N1 and the target node (output node) Nk is N3. Even if there is a failure in the path of N2-N3 or there is a failure in the node N2, a detour path is available because the path of N1→N7→N3, N1→N7→N4→N3, etc., can communicate.

Incidentally, in the network shown in FIG. 8, the nodes N2 and N6 transmit light and receive light having a wide angle of 180 degrees, and the nodes N3 to N5 and N7 transmit light and receive light having a wide angle of 360 degrees. In such a case, a structure of an optical wireless communication transceiver capable of transmitting an optical signal to the 180° or 360° directions and receiving an optical signal from the 180° or 360° directions is preferred in order to communicate with an adjacent node.

Figure 9:
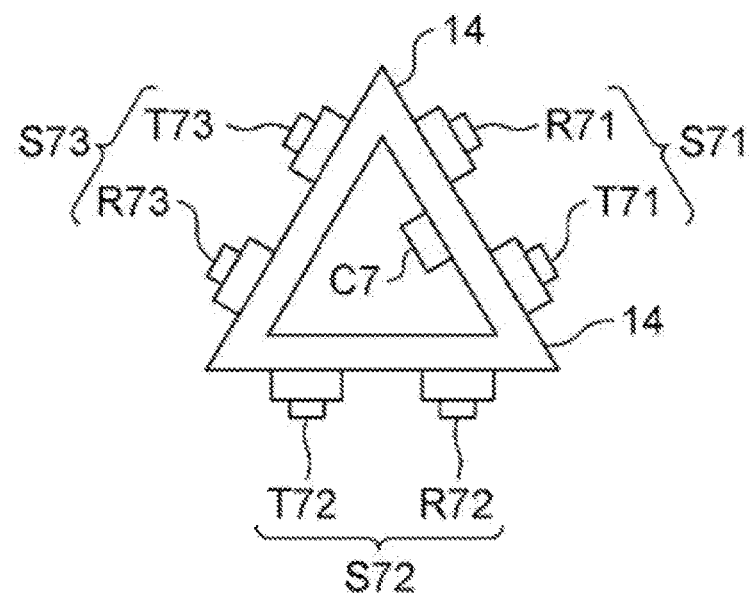
FIG. 9 is a diagram showing the first example of the structure of an optical wireless communication transceiver capable of transmitting and receiving an optical signal at a wide angle.

FIG. 9 shows an example of the structure of an optical wireless communication transceiver Si capable of transmitting optical signals to the 360-degree direction and receiving optical signals from the 360-degree direction. An optical wireless communication transceiver is placed on each side of the triangular support 14. The optical receiver Ri and the optical transmitter Ti are separated from the housing of FIG. 2 and arranged side by side on each surface of the support 14. The optical receiver R71 and the optical transmitter T71 on the first surface, the optical receiver R72 and the optical transmitter T72 on the second surface, the optical receiver R73 and the optical transmitter T73 on the third surface are arranged so that these optical receivers and the optical transmitters on the same surface are aligned the optical axes to the same direction and arranged side by side. The optical receiver R71 and the optical transmitter T71 constitute the optical wireless communication transceiver S71, The optical receiver R72 and the optical transmitter T72 constitute the optical wireless communication transceiver S72, The optical receiver R73 and the optical transmitter T73 constitute the optical wireless communication transceiver S73, each of the optical receivers R71, R72 and R73 has the light receiving angle of, for example, 120 degrees, each optical transmitter T71, T72, T73 has the light emission angle of, for example, 120 degrees. Thus, by arranging the respective optical wireless communication transceivers on the respective surfaces of the triangle, it becomes possible to transmit and receive in all directions of 360 degrees. Note that one controller C7 is commonly used in the three optical wireless communication transceivers S71, S72, and S73.

In the embodiment of FIG. 9, the optical wireless communication transceiver is arranged on three sides of the triangular support 14 to cover a wide angle of 360 degrees. If the optical wireless communication transceiver is arranged on two sides of the triangular support 14 it is possible to realize a wide angle of 240 degrees. it is applicable to the optical wireless communication transceiver S2, S6 in the nodes N2, N6.

As described above, according to the present embodiment, similarly to the first embodiment, a network capable of 1:n communication in the optical wireless mesh network can be provided. Further, it is possible to improve the transmission characteristics of the optical wireless mesh network and to bypass the link more reliably.

Example 3

In the present embodiment, an example will be described in which the network is a square network structure, and optical communication is performed between adjacent nodes of the square network structure and between nodes on diagonal lines. The number of adjacent nodes is 2 to 4, and the number of communication partners is n=3 to 8.

Figure 10:
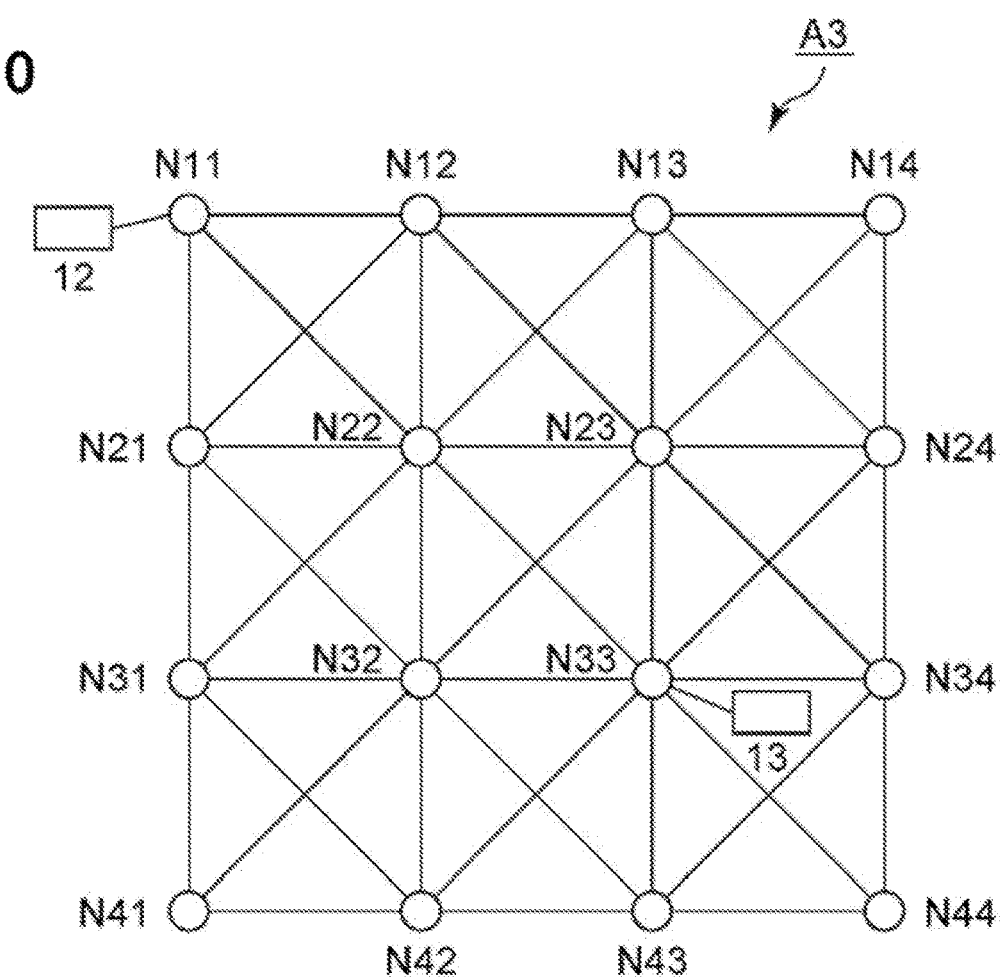
FIG. 10 is a diagram showing a configuration example of an optical wireless mesh network communication system A3 according to the third embodiment.

FIG. 10 shows a network configuration of the optical wireless mesh network communication system A3 according to the present embodiment. Nodes N11 to N44 are arranged in the nodes of the square mesh. The input apparatus 12 is connected to N 11, and the output apparatus 13 is connected to N33. The optical transmitter T11 in the node N11 transmits optical signals to the other nodes N12, N21, and N22. The optical receiver R11 in the node N11 also receives optical signals from the other node N12, N21, N22. The optical wireless communication transceiver S12 in the node N12 communicates with the optical wireless communication transceivers in the nodes N11, N13, N21, N22, and N23. The optical wireless communication transceiver S22 in the node N22 communicates with the optical wireless communication transceivers in the nodes N11, N12, N13, N21, N23, N31, N32, and N33. The functions of the input apparatus 12 and the output apparatus 13 are the same as those of the first embodiment. Therefore, it is possible to provide a network capable of 1:n communication in each square optical wireless mesh network.

Here, the network composed of N11, N12, N21, and N22 satisfies the first aspect. The other eight square networks also satisfy the first aspect. It can be said that the entire network is composed of nine square networks satisfying the first aspect. That is, the present embodiment corresponds to the third aspect similarly to embodiment 7 described later.

In FIG. 10, assume that the input node is N11 and the target node (output node) Nk is N33. Since the path of the N11→N22→N33 can communicate even when the N12-N23 path is faulty or the node N12 is faulty, the detour can be used. Further, since the communication path N11→N22 on the diagonal line other than the adjacent nodes of the network structure or the like is also possible, the detour can be increased, the detour can be more reliably.

By the way, it is possible to form a large network by combining a large number of minimum networks of squares. When the nodes are arranged as shown in FIG. 10, there are other nodes in the 8 directions in the node N22, N23, N32, N33. In such a case, a structure of an optical wireless communication transceiver capable of transmitting an optical signal in a 360-degree direction and receiving an optical signal from a 360-degree direction is preferred in order to communicate with an adjacent node.

Figure 11:
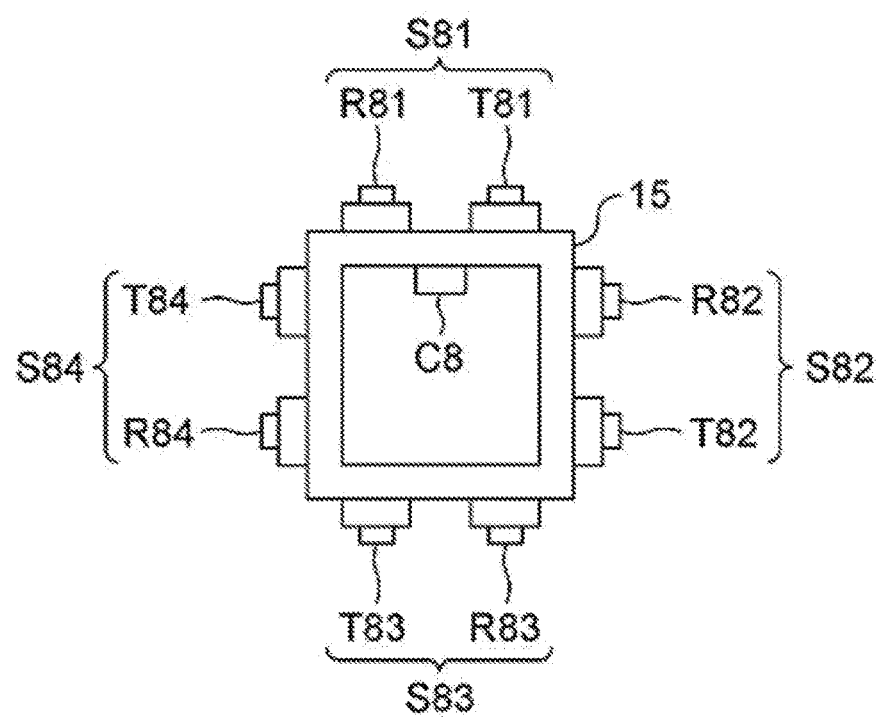
FIG. 11 is a diagram showing a second example of a structure of an optical wireless communication transceiver capable of transmitting and receiving an optical signal with a wide angle.

FIG. 11 shows a second example of a structure of an optical wireless communication transceiver capable of transmitting optical signals to the 360 degree direction and receiving optical signals from a 360-degree direction. The optical wireless communication transceiver on each surface of the square support 15 is placed. The optical receiver Ri and the optical transmitter Ti are separated from the housing of FIG. 1. and arranged side by side on each surface of the support 15. The optical receiver R81 and the optical transmitter T81 are arranged on the first surface, the optical receiver R82 and the optical transmitter T82 are arranged on the second surface, the optical receiver R83 and the optical transmitter T83 are arranged on the third surface, the optical receiver R84 and the optical transmitter T84 on the fourth surface, these optical receivers and the optical transmitters on the same surface are aligned the optical axes to the same direction and arranged side by side. The optical receiver R81 and the optical transmitter T81 constitute the optical wireless communication transceiver S81, the optical receiver R82 and the optical transmitter T82 constitute the optical wireless communication transceiver S82, the optical receiver R83 and the optical wireless communication transceiver S83 constitute the optical wireless communication transceiver S83, the optical receiver R84 and the optical transmitter T84 constitute the optical wireless communication transceiver S84, each optical receiver R81-R84 has light receiving angle of, for example, 90 degrees, and each optical transmitter T81-T84 has a light emission angle of, for example, 90 degrees. Thus, arranging each optical wireless communication transceiver on each surface of the square, transmission and reception in all directions of 360 degrees becomes possible. Note that one controller C8 is shared for the four optical wireless communication transmitters/receivers S81 to S84.

In the embodiment of FIG. 11, it is possible to cover a wide angle of 360 degrees by placing the optical wireless communication transceivers on the surfaces of four sides of the square support 15. If the optical wireless communication transceivers are placed on the surfaces of two sides of the square support 14, since it is possible to realize a wide angle of 180 degrees, it is applicable to the optical wireless communication transceivers in such as node N12, N13 of FIG. 10. Further, although the optical receiver Ri and the optical transmitter Ti are arranged side by side in the lateral direction (horizontal direction) in FIG. 11, depending on the installation location, may be arranged side by side in the longitudinal direction (vertical direction).

As described above, according to the present embodiment, similarly to the first embodiment, a network capable of 1:n communication in an optical wireless mesh network can be provided. Further, it is possible to improve the transmission characteristics of the optical wireless mesh network and to bypass the link more reliably.

Example 4

Figure 12:
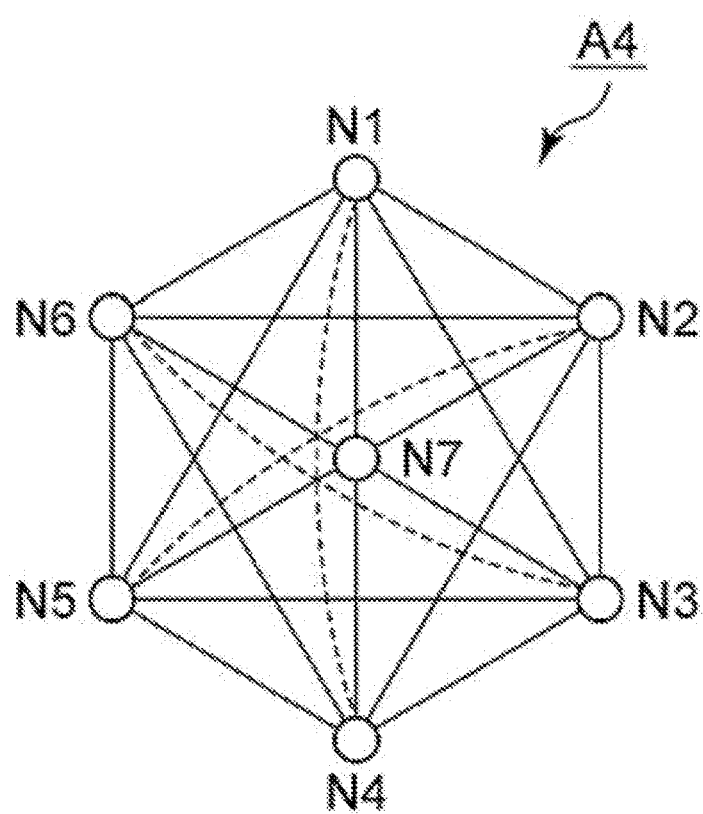
FIG. 12 is a diagram showing a configuration example of an optical wireless mesh network communication system A4, according to the fourth embodiment.

FIG. 12 shows an example of the network configuration of the optical wireless mesh network communication system A4 according to the present embodiment. In the present embodiment, an example will be described in which the node N7 is added in the middle of the optical wireless mesh network communication system A1 according to the first embodiment, and therefore direct communication between N1-N4, N2-N5, N3-N6 becomes impossible, but N1-N7-N4, N2-N7-N5, N3-N7-N6 communication via the node N7 is enabled. The network configuration is a modification of the square mesh of Example 3. The network according to the present embodiment is also a square network structure in which the number of adjacent nodes is 3 to 6 and the number of communication partners is n=5 to 6. The communication path is further capable of N1-N3, N1-N5, N2-N4, N2-N6, N3-N5, N4-N6.

Assume that the input node is Ni and the target node (output node) Nk (k is a positive integer) is N3. Since the path of the N1→N7→N3 can communicate even when the N1-N2 path has a faulty or the node N2 has a faulty, the detour can be used. In addition, a network capable of 1:n communication in each square network can be provided.

When the position of the node N7 is raised to enable direct communication between N1-N4, N2-N5, N3-N6, the node N7 is added to the network communication system of the first embodiment, and the communication path of the broken line part of FIG. 12 is added to the network communication system of the first embodiment, which is the case of the number of nodes 7 and n=6 according to the first embodiment.

As described above, according to the present embodiment, similarly to the first embodiment, a network capable of 1:n communication in the optical wireless mesh network can be provided. Further, it is possible to improve the transmission characteristics of the optical wireless mesh network and to bypass the link more reliably.

Example 5

Figure 13:
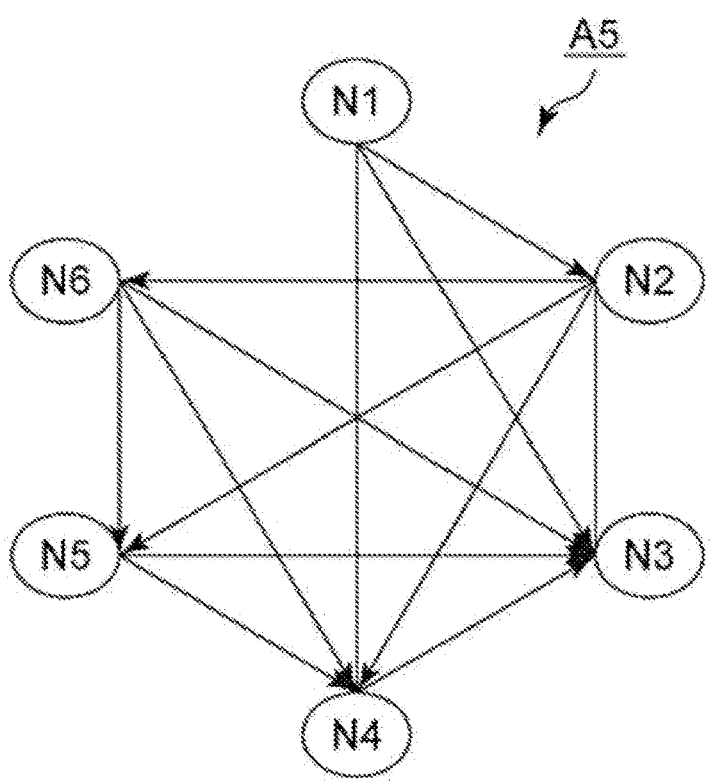
FIG. 13 is a diagram showing a configuration example of an optical wireless mesh network communication system A5 according to the fifth embodiment.

FIG. 13 shows an example of the network configuration of the optical wireless mesh network communication system A5 according to the present embodiment. In the present embodiment, an example in which the optical wireless communication transceiver of any node can communicate with the optical wireless communication transceiver of 3/5 or more of the other nodes among all the nodes will be described in the first aspect.

Compared to the first embodiment, there is no route of the N1→N5 and no route of the N1→N6. For example, this is the case where there is a building which becomes an obstacle in the directions of N5 and N6 as seen from N1. Therefore, the optical wireless communication transceivers capable of communicating with the optical wireless communication transceiver S1 (see FIG. 1) in the node N1 are nodes N2 to N4 corresponding to 3/5 of the total N2 to N6. Although direct communication of the N1→N5 and the N1→N6 is not possible, a detour can be formed by forming a path through N2 to N4.

The rest is the same as in the first embodiment, and according to the present embodiment, a network capable of 1:n communication in the optical wireless mesh network can be provided. Further, it is possible to improve the transmission characteristics of the optical wireless mesh network and to bypass the link more reliably.

Example 6

Figure 14:
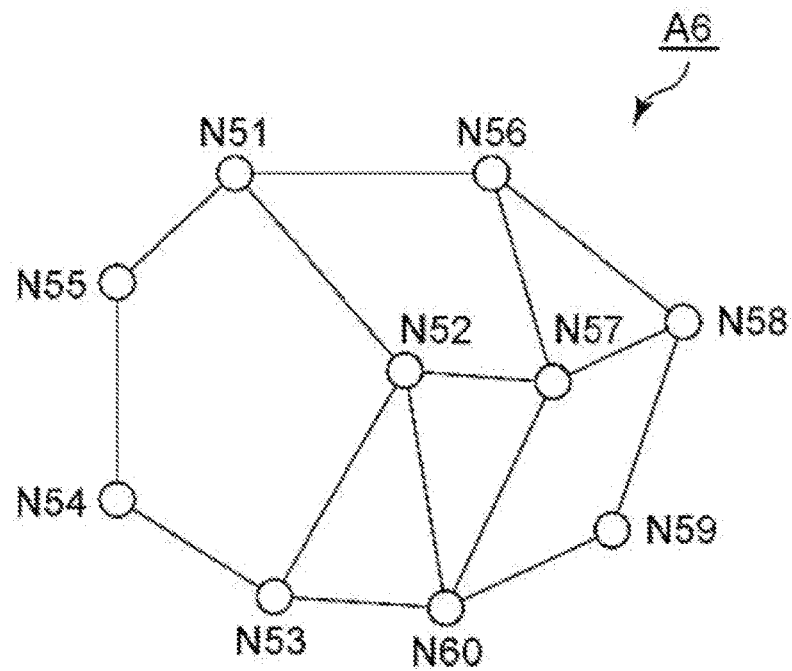
FIG. 14 is a configuration example of an optical wireless mesh network communication system A6, according to a sixth embodiment.

FIG. 14 shows an example of the network configuration of the optical wireless mesh network communication system A6 according to the present embodiment. In this embodiment, a description will be given of an example consisting of a network of a mesh structure in which polygons having different angles are mixed.

In FIG. 14, N51-N52-N53-N54-N55-N51 forms a pentagon, N51-N56-N57-N52-N51 and N56-N57-N52-N51-N56 form a rectangle, and N52-N60-N53-N52, N52-N57-N60-N52, and N56-N58-N57-N56 form a triangle. As described above, the network in the present embodiment is a network having a network structure in which triangles, squares, pentagons, and polygons having different angles are mixed. Also in this case, a detour can be formed for a path from any node to any other node. In addition, at any node, two or more adjacent nodes can communicate over 1:2 communication.

Others are the same as in the second embodiment, and according to the second embodiment, a network capable of 1:n communication in the optical wireless mesh network can be provided, as in the second embodiment. Further, it is possible to improve the transmission characteristics of the optical wireless mesh network and to bypass the link more reliably.

Example 7

In the present embodiment, an example of a wide area optical wireless mesh network communication system A7 is described which includes partially the optical wireless mesh network communication system A1 according to the first embodiment.

Figure 15:
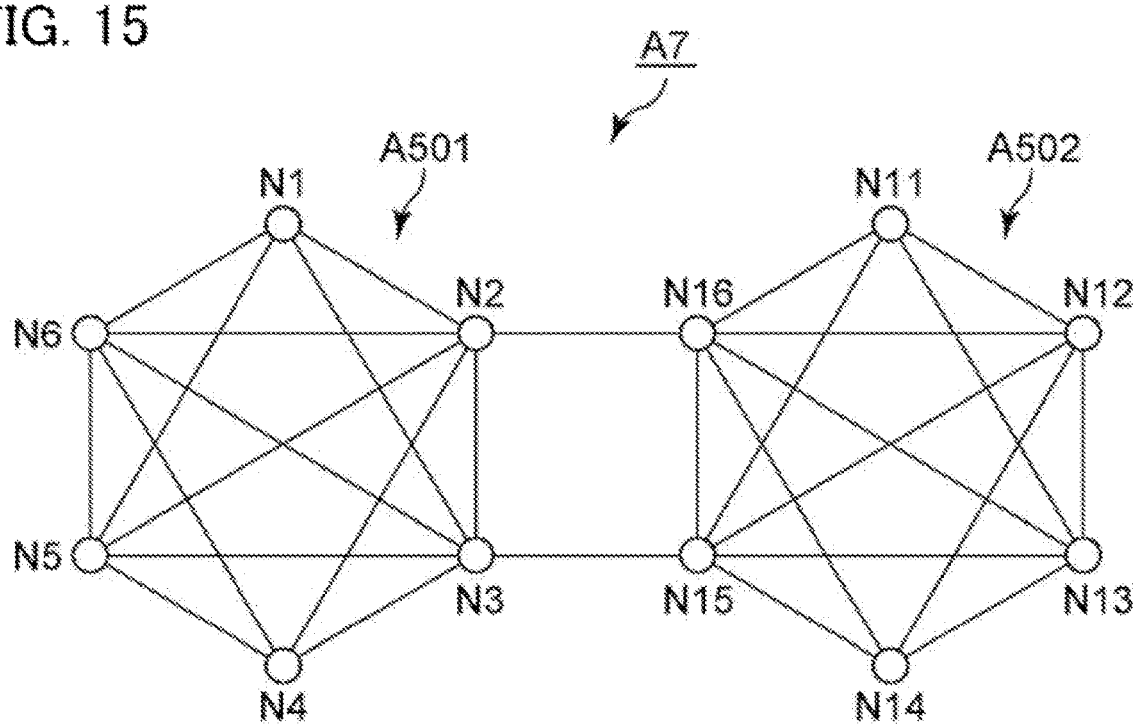
FIG. 15 is a configuration example of an optical wireless mesh network communication system A7, according to a seventh embodiment.

FIG. 15 shows an example of the network configuration of the optical wireless mesh network communication system A7 according to the present embodiment. In the optical wireless mesh network communication system, it is not always necessary to apply 1:n communication over the entire area, and it is sufficient that it is partially used. In FIG. 15, there are two optical wireless mesh networks for 1:n communication, namely, there are a network A501 of N1 to N6 and a network A502 of N11 to N16, and both networks are connected by two paths of N2-N16 and N3-N13. Even in such a configuration, it is possible to form a detour circuit.

As described above, according to the present embodiment, similarly to the first embodiment, a network capable of 1:n communication in the optical wireless mesh network can be provided. Further, it is possible to improve the transmission characteristics of the optical wireless mesh network and to bypass the link more reliably.

Example 8

Figure 16A:
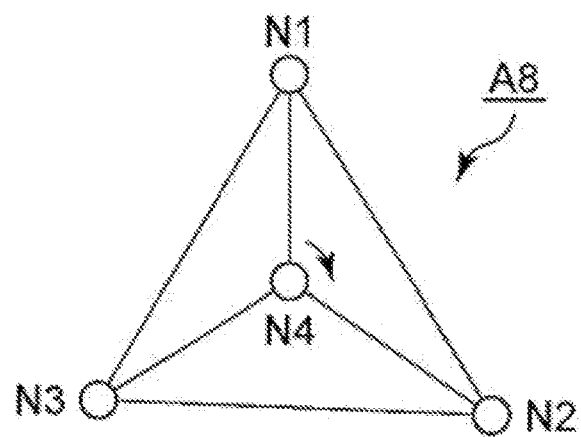
FIG. 16A is a diagram showing a configuration example of an optical wireless mesh network communication system A8, according to the eighth embodiment.

FIGS. 6A to 16C show configuration examples of the optical wireless mesh network communication systems A8 to A10 according to the present embodiment. In these embodiments, an example in which nodes can be moved is described. FIG. 16A shows a configuration example of an optical wireless mesh network communication system A8 that remotely controls a movable heavy machine in civil engineering work. N1 is a node having a management terminal, N2 and N3 are nodes supporting management, N4 is a node having a movable heavy machine, the management terminal in the node N1 remotely operates the heavy machine in the node N4. In N1 to N3, optical wireless communication receivers S1 to S3 (see FIG. 2) are placed at relatively high positions, and communicates with the optical wireless communication receiver S4 (see FIG. 2) placed on the heavy machine in the relatively low node N4 through the optical wireless mesh network communication system A8. Network consisting of nodes N1 to N4 satisfies the requirements of the first aspect and the second aspect, although the number of nodes and the positional relationship between the nodes are different from those of the first aspect and the second aspect. Depending on the circumstances of the civil engineering work, N4 may become invisible from N1 due to the accumulated earth and stones. In such a case, if communication can be performed by bypassing N2 and N3, remote control becomes possible. Since the optical wireless communication transceiver S4 in the node N4 is movable, the configuration as shown in FIG. 9 or FIG. 11 is preferable so that optical transmission can be performed to the 360 degrees direction and optical reception can be performed from the 360 degrees direction. Further, as shown in FIG. 1, since there are no controllers in the relay nodes N2 and N3 and the routing processing is not performed even in the nodes N1 and N4 having the controllers, the processing time in the network is fast.

Figure 16B:
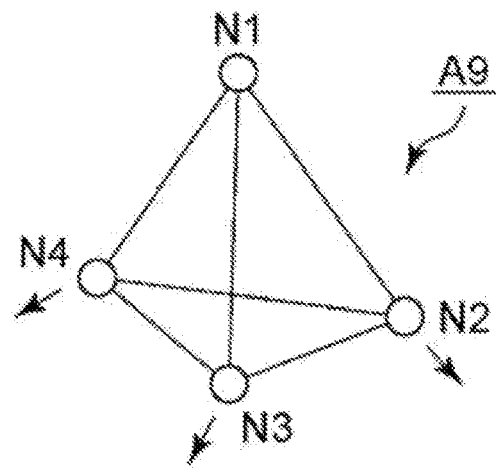
FIG. 16B is a diagram showing a configuration example of an optical wireless mesh network communication system A9, according to the eighth embodiment.

FIG. 16B shows a configuration example of an optical wireless mesh network communication system A9 that a management terminal communicates with each of a plurality of moving construction sites in construction work. N 1 is a node having a management terminal, and N2 to N4 are nodes at each construction site and have optical wireless communication transceivers S2 to S4 (see FIG. 2), respectively. The building in which the management office is located and the building to be constructed is located opposite each other across the major street, and the nodes of the construction site are changed in accordance with the progress of the construction (for example, the floor of the construction rises upward). The optical wireless communication transceiver S1 in the node N1 communicates with the optical wireless communication transceivers S2-S4 in the nodes N2-N4. The optical wireless communication transceivers S2 to S4 in the nodes N2 to N4 can also communicate with each other. The network consisting of nodes N1 to N4 satisfies the requirements of the first aspect and the second aspect, although the number of nodes and the positional relationship between the nodes are different from those of the first embodiment and the second embodiment. Depending on the status of the construction work, one of the nodes may not be visible from node N1. If communication is possible by bypassing the nodes that are visible in such a case, it becomes possible to communicate with the nodes that are no longer visible. Since the optical wireless communication transceivers S2-S4 in the nodes N2-N4 are movable, a configuration that can transmit light in the 360-degree direction and can receive light from the 360-degree direction is preferred. Also, because the nodes N1 to N4 with controllers do not perform routing processing, the processing time in the network is fast.

Figure 16C:
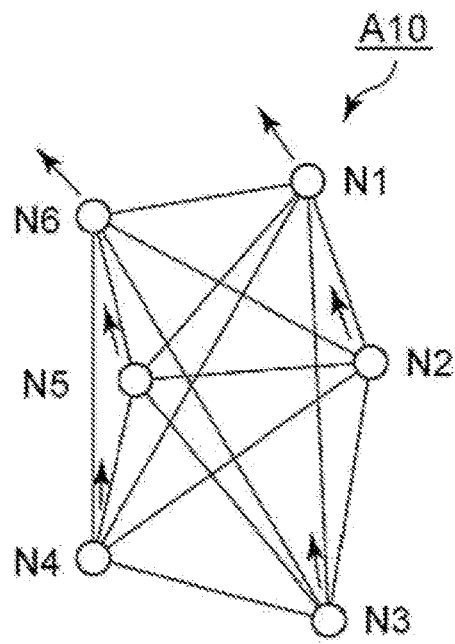
FIG. 16C is a configuration example of an optical wireless mesh network communication system A10, according to an eighth embodiment.

FIG. 16C shows a configuration example of an optical wireless mesh network communication system A10 in which each ship has an optical wireless communication transceiver and mutually communicates in a fleet. N1 to N6 are nodes installed on each ship, and each has optical wireless communication transceivers S1 to S6 (see FIG. 2). For example, six ships navigate in two rows. The nodes N1-N2 are located in relatively high-visibility locations on the ship for easy intercommunication. As the ship progresses, the positional relationship between the nodes changes, but the requirements of the first aspect are satisfied. However, the light between two nodes may be blocked, such as when ships overlaps on a straight-line. If communication is possible by bypassing the nodes that are visible in such a case, communication becomes possible between the nodes that are no longer visible. Since the optical wireless communication transceivers S1 to S6 in the nodes N1 to N6 are movable, a configuration in which optical transmission can be performed to the 360-degree direction and optical reception can be performed from the 360-degree direction is preferred. Also, because the nodes N1 to N6 with controllers do not perform routing processing, the processing time in the network is fast. It is to be noted that the requirements of the second aspect are satisfied by forming two square meshes N1-N2-N5-N6, N2-N3-N4-N5. In this case, when the positions of the individual ships are changed, the overall arrangement of the nodes is not changed, and therefore, the flow of the light transceiver space is the same as that before the change. In addition, it is possible to form a detour route in which a failure occurs in a communication path or a node.

As described above, according to the present embodiment, similarly to the first embodiment, a network capable of 1:n communication in the optical wireless mesh network can be provided, even when a node is movable. Further, it is possible to improve the transmission characteristics of the optical wireless mesh network and to bypass the link more reliably.

Example 9

In the present embodiment, an application example of an optical wireless mesh network communication system having a possibility of practical application is described. It is practical to apply an optical wireless mesh network communication system to a place where communication is difficult in a conventional network, and to use a conventional network otherwise.

Figure 17:
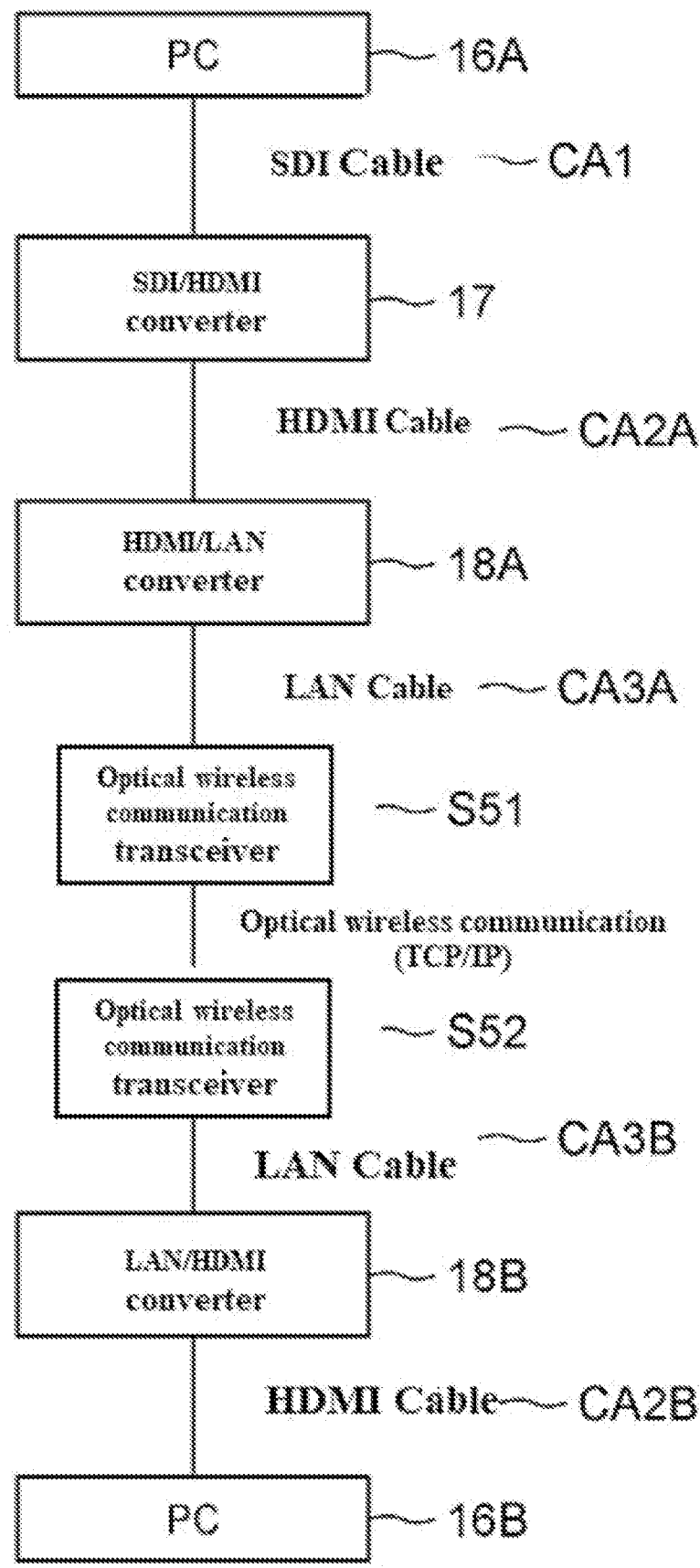
FIG. 17 is a diagram showing a configuration example of a communication system for transmitting image data from the terminal 16A to the terminal 16B.

FIG. 17 shows a configuration example of a communication system that transmits image data in which text data and voice data are added to the terminal 16B from the terminal 16A. SDI (Serial Digital Interface) image data of the protocol terminal is transmitted by a SDI cable CA1, converted into a HDMI (High-Definition Multimedia Interface) protocol by a SDI/HDMI (registered trademark) converter 17, transmitted by a HDMI cable CA2A, converted into an optical communication protocol (TCP/IP) of a LAN (Local Area Network) by a HDMI/LAN converter 18A, and guided to the optical wireless communication transceiver S51 by a LAN cable CA3A. Optical wireless communication is performed between the optical wireless communication transceiver S51 and the optical wireless communication transceiver S52. The light received by the optical transceiver S52 is transmitted by the LAN cable CA3B, converted into HDMI protocol by LAN/HDMI converter 18B, and transmitted to the terminal 16B by HDMI cable CA2B. Thus, the terminal 16A transmits the image data to which the voice data is added to terminal 16B, and the image data transmitted can be observed by the monitor of the terminal 16B.

For example, it is possible to transmit image data for a large vision from a terminal 16A in a room of a building to a terminal 16B in a coffee shop of an opposite building sandwiching a large street, transmit music as an inaudible sound, observe an image with an LED vision of the terminal 16B, and listen to the music with a mobile phone. It is difficult to install an optical cable between buildings across a large street, and it is convenient to use optical wireless communication for communication between buildings.

In addition, when visual optical communication is used in cases where it is difficult to install surveillance cameras and Wi-Fi, for example, for river surveillance and surveillance of important cultural properties, there are advantages such as minimization of installation work of wired cables, the omission of installation work, elimination of heavy machinery, communication without selecting a place above a river, and no loss of landscape with no cable. Further, in difficult case to lay the cable in the conventional communication technology, for example, when remote operation and unmanned enforcement of architectural and civil engineering construction site, etc., is required, when the investigation by the robot and survey machine of the place where no human can enter, use of the visible light communication brings advantages such as cable-less large-capacity communication and improvement of workability and progress of investigation accuracy by the high-resolution camera can be achieved. Further, use of visible light communication for installation of a high-resolution camera, installation at a high place or for long distance, and for an event where the number of large people gathers in one place, brings advantages such that it is possible to communicate in a large capacity, outdoors or Long-distance, and it is possible to be used as a large-capacity communication means necessary for a limited period or temporarily, or the like, even in a place where the camera could not be conventionally installed. In addition, even if the communication infrastructure is insufficient, there are advantages such as large-capacity communication becomes possible in tunnels and underground spaces where radio waves do not reach, and the possibility of underwater communication arises where radio waves cannot be used. In addition, even in the case where cameras and signage (information/advertisement media for displaying images and characters on a flat display or a projector by using digital technologies for display and communication) are desired to be attached later, in a place where there is radio interference such as in an elevator in Wi-Fi wave, use of visible light communication bring advantages such as no need for replacement of tail cords (electric wires suspended under a "car" of an elevator), elimination of the risk of disconnection of communication cables, absence of radio interference, and simplification of after-installation. In addition, optical wireless communication using LEDs for advertisements and lighting in shopping districts, stations, and the like is also possible. In this way, a network can be constructed inexpensively by using existing facilities.

Example 10

In this embodiment, multi-value communication and multi-communication will be described.

This is convenient because multiple contents can be transmitted simultaneously for multiple communications. For example, in wired optical communication using an optical fiber, time division multiplex communication such as the simultaneous transmission of light in a plurality of modes, space division multiplex communication for simultaneous transmission in a multi-core optical fiber, and time division multiplex communication for transmission of a plurality of contents by time division is performed. In optical wireless communication, instead of multicore, communication using a plurality of optical wireless communication transceivers Si can also be multiplexed. Frequency (wavelength) multiplexing is also possible.

Concerning multi-level communication, since the amount of information to be transmitted at a time can be increased by placing multi-level data on one optical pulse, the transmission time can be greatly shortened. For example, since it includes 4 bit of data in one optical pulse when one optical pulse has 16 values, therefore the utilization efficiency of the frequency is increased, it is possible to shorten the transmission time to 1/4. In optical wireless communication, methods to utilize phase differences between pulses such as DPSK (Differential Phase-Sift-Keying), DQPSK (Differential Quaternary Phase-Sift-Keying) have been proposed. Multi-level transmission of 128 values has been reported by coherent QAM (Quadrature Amplitude Modulation) transmission technology (Masataka Nakazawa, "Develop a new optical communication method to improve the utilization efficiency of frequency by a factor of 10-realization of coherent QAM optical transmission technology-", [online], [Search on Sep. 30, 2018], internet, URL=www.riec.tohoku.ac.jp/activity/pr/ . . . /nakazawa071102.pdf). Also in this embodiment, these multiplexing techniques can be applied, also OFDM (orthogonal frequency division multiplexing, Wavelet-OFDM (wavelet orthogonal frequency multiplexing, Wavelet Orthogonal Frequency Division Multiplexing), Orthogonal Frequency Division Multiplexing), PPM (pulse position modulation, Pulse-Position Modulation) multi-level technique can be applied.

While embodiments of the present invention have been described above, it is apparent that the embodiments are not limited to the above examples, and various changes may be made without departing from the spirit of the present invention. In the above embodiment, the examples that shape of the mesh is triangular, square, and hexagonal are described. However, when applied to the real world, a deformed shape is used. However, since in the network structure, the light-emitting angle and the light receiving angle is a wide angle, an optical wireless mesh network communication system can be constituted as long as it can constitute a detour circuit, by applying the present invention.

In the case of a wide-area optical wireless mesh network communication system, a network having a triangular, square, or hexagonal network may be connected to each other. Also, the inner angle of the polygon may be any angle and may be greater than 180 degrees. Further, concerning the optical wireless communication transceiver, an unnecessary angle (a direction without the communication partner), and the light emission and reception, a light-shielding mask covering a part of the opening for suppressing noise (maybe a mask position adjustable) may be added, Further, it may be devised to save energy by reducing the applied voltage to the light emitting device such as to prolong the life of the battery, while securing the distance of the transmission light (e.g., 20 m). In addition, the shape and dimensions of the optical receiver and the optical transmitter, the light receiving angle and the light-emitting angle, the type and characteristics of the light emitting device and the receiving device, the function of the controller, and the like can be appropriately changed.

INDUSTRIAL APPLICABILITY

The present invention can be used for optical wireless communication.

EXPLANATION OF REFERENCES

2: APD device
3~5: Terminal
10, 10R, 10S: Housing
11R, 11S: Optical component
12: Input apparatus
13: Output apparatus
12&13: Input/Output apparatus
14,15: Support
16A, 16B: Terminals
17: SDI/HDMI converter
18A: HDMI/LAN converter
A1-A10, A501, A502: Optical wireless mesh network communication system
C: Capacitor
Ci: Controller
CAi, Cai: Cable
Di1: Optical transmitter drive circuit
Di2: Optical receiver drive circuit
Ii: Interface
Ni (i=positive integer): Node
Nj: Node to communicate with
Nk: Target node
n: Number of communicating parties
R: Resistor
Ri: Optical receiver
Si: Optical wireless communication transceiver
Ti: Optical transmitter
θ: Receiving angle, Emission angle

The invention claimed is:

1. An optical wireless mesh network communication system; comprising
an optical wireless communication transceiver having an optical transmitter and an optical receiver and an optical fiber cable or a coaxial cable for transmitting signals received by the optical receiver to the optical transmitter in each node;
the optical wireless mesh network communication system connects n+1 nodes (n is a positive integer greater than or equal to 2, hereinafter the same in the claims) in the network; wherein
the optical wireless communication transceiver in each of the nodes is capable of communicating with the optical wireless communication transceiver in the correspondent node if the correspondent node satisfies conditions that (1) the correspondent node is within a predetermined straight-line distance for optical communication, (2) there is no obstacle blocking or absorbing light on the way, and (3) both the optical transmitter and the optical receiver are active;
the optical wireless communication transceiver in each of the nodes is capable of simultaneously transmitting with a wide angle of transmitted light to 3/5 or more optical wireless communication transceivers in the other n nodes and simultaneously receiving a wide angle of transmitted light from 3/5 or more optical wireless communication transceivers in the other n nodes when its own node and all of the other n nodes satisfy the conditions of (1) to (3);
in each of the nodes, the optical wireless communication transceiver includes a controller for format conversion of the input signal to a communication signal according to the network when an input signal is input from the input apparatus in a node to which the input apparatus is connected, and a controller for format conversion of a communication signal relating to the network to the output signal when the output apparatus outputs an output signal from the optical wireless communication transceiver to the output apparatus in a node to which the output apparatus is connected;
the optical receiver having a photodiode (hereinafter also referred to as "PD" in the claims), a resistor, and a capacitor connected on the downstream side in the electric current flow direction of the PD; wherein the optical receiver has a peak of a light receiving wavelength set to a wavelength shorter than the wavelength of ambient light, a function of performing a multiplication function in response to the energy of an incident photon unit, a function of not accepting the next photon until one photon enters and the multiplication function is restored, and when a voltage is applied between the terminals of the PD, a free carrier in the PD is activated, when the photon enters the PD in such a state, electrons are multiplied in the PD, electric current by the multiplied electrons is output; wherein the optical receiver which is a photon detection receiver having a device is capable to detect an alternating electric current component corresponding to the acceleration fluctuation of the photon passing through the capacitor from the output current as a signal is used.

2. An optical wireless mesh network communication system; comprising
an optical wireless communication transceiver having an optical transmitter and an optical receiver and an optical fiber cable or a coaxial cable for transmitting signals received by the optical receiver to the optical transmitter in each node;
the optical wireless mesh network communication system connects n+1 nodes (n is a positive integer greater than or equal to 2, hereinafter the same in the claims) in the network; wherein
the optical wireless communication transceiver in each of the nodes is capable of communicating with the optical wireless communication transceiver in the correspondent node if the correspondent node satisfies conditions that (1) the correspondent node is within a predetermined straight-line distance for optical communication, (2) there is no obstacle blocking or absorbing light on the way, and (3) both the optical transmitter and the optical receiver are active;

the optical wireless communication transceiver in each of the nodes is capable of simultaneously transmitting with a wide-angle of transmitted light to 3/5 or more optical wireless communication transceivers in the other n nodes and simultaneously receiving a wide-angle of transmitted light from 3/5 or more optical wireless communication transceivers in the other n nodes when its own node and all of the other n nodes satisfy the conditions of (1) to (3);

in each of the nodes, the optical wireless communication transceiver includes a controller for format conversion of the input signal to a communication signal according to the network when an input signal is input from the input apparatus in a node to which the input apparatus is connected, and a controller for format conversion of a communication signal relating to the network to the output signal when the output apparatus outputs an output signal from the optical wireless communication transceiver to the output apparatus in a node to which the output apparatus is connected;

in each of the nodes, some of the optical wireless communication transceivers have a controller, and some do not have, the proportion of the nodes having controller is 50% or less, and the controllers do not perform routing processing and performs remote control of the optical wireless communication transceivers in the nodes having no controller in addition to control of the optical wireless communication transceiver of its own node.

3. The optical wireless mesh network communication system; including the optical wireless mesh network communication system according to claim 1 partially and being wide-area communication system.

4. The optical wireless mesh network communication system according to claim 1; wherein
the angle of the transmission direction of the optical transmitter and the angle of the reception direction of the optical receiver is a wide-angle,
a plurality of optical transmitters are combined to form the transmitting portion of the optical wireless transceiver when the other n nodes do not fall within the angle of the transmitting direction, and a plurality of optical receivers are combined to form the receiving portion of the optical wireless transceiver when the other n nodes do not fall within the angle of the receiving direction.

5. The optical wireless mesh network communication system according to claim 1; wherein
in the optical wireless communication transceiver in each node, if the optical transmitter emits a signal, the controller deactivates the optical receiver immediately before and activates after a predetermined period has elapsed.

6. The optical wireless mesh network communication system according to claim 1; wherein
the value of the light-receiving signal in each said node is obtained by comparing the amount of light received by combining the signals from the other nodes with the reference value;
transmitting signal from the optical transmitter at each said node is transmitted at a uniform predetermined amount of light.

7. The optical wireless mesh network communication system according to claim 1; wherein
multiple communication is employed for communication between the optical wireless communication transceivers.

8. The optical wireless mesh network communication system according to claim 1; wherein
the signals of communication between the optical wireless communication transceivers are represented by multiple values.

9. The optical wireless mesh network communication system according to claim 1; wherein
the controller compares the measurable amount of light received in each of the nodes with the accumulated data at the time of abnormality to determine that a failure has occurred in the same or similar case.

10. The optical wireless mesh network communication system according to claim 1
in each said node, the optical transmitter attaches an identification symbol of its own node at the time of signal transmission;
the controller determines the location of the fault by tracking the path of the abnormal data.

11. The optical wireless mesh network communication system according to claim 1; wherein
an optical wireless communication transceiver installed in any of the nodes is configured to be movable.

* * * * *